United States Patent
Maki et al.

(10) Patent No.: US 8,707,805 B2
(45) Date of Patent: Apr. 29, 2014

(54) TRANSFER APPARATUS AND TRANSFER METHOD

(71) Applicant: Tokyo Electron Limited, Tokyo (JP)

(72) Inventors: Junnosuke Maki, Koshi (JP); Mitsuteru Yano, Koshi (JP); Seiji Nakano, Koshi (JP); Tsuyoshi Watanabe, Koshi (JP); Yasunori Toyoda, Koshi (JP); Suguru Enokida, Koshi (JP); Naruaki Iida, Koshi (JP); Hiroki Harada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/716,659

(22) Filed: Dec. 17, 2012

(65) Prior Publication Data

US 2013/0166064 A1    Jun. 27, 2013

(30) Foreign Application Priority Data

Dec. 26, 2011    (JP) .................................. 2011-284213

(51) Int. Cl.
*G01D 7/00*    (2006.01)
*G01L 3/14*    (2006.01)

(52) U.S. Cl.
USPC ............. 73/862.381; 73/862.041; 73/862.321

(58) Field of Classification Search
USPC ........ 73/862.381, 862.041–43, 862.321–322, 73/862.194, 862.391, 862.392–393
See application file for complete search history.

(56) References Cited

U.S. PATENT DOCUMENTS 6,050,389 A * 4/2000 Iida et al. .................. 198/341.01
7,622,876 B2 * 11/2009 Plunkett et al. ............... 318/430

FOREIGN PATENT DOCUMENTS

JP    2011042463 A *  3/2011
JP    A-2011-42463     3/2011

* cited by examiner

*Primary Examiner* — Lisa Caputo
*Assistant Examiner* — Brandi N Hopkins
(74) *Attorney, Agent, or Firm* — Posz Law Group, PLC

(57) ABSTRACT

A transfer apparatus for mounting and transferring a transferred component on a driven means, the transfer apparatus includes: a driving means for rotating a driving side pulley by a rotational driving force of a motor to move a belt wound around the driving side pulley, thereby moving the driven means coupled to the belt in a predetermined direction; and a transfer monitoring means for monitoring a transfer state of the driven means, wherein the transfer monitoring means detects a torque value of the motor required to move the driven means, calculates a torque differential value of the torque value with respect to time based on the detected torque value, and detects the transfer state using the calculated torque differential value.

11 Claims, 19 Drawing Sheets

TRANSFER APPARATUS AND TRANSFER METHOD

BACKGROUND OF THE INVENTION

1. Field of the Invention

The present invention relates to a transfer apparatus and a transfer method for detecting a transfer state of a substrate, when mounting and transferring a semiconductor wafer, a glass substrate for flat panel display and other substrates thereon.

2. Description of the Related Art

Apparatuses for processing a substrate such as a semiconductor wafer (substrate processing apparatuses) include the one that transfers the substrate stored in a substrate waiting part to a substrate processing part. Methods of transferring the substrate to the substrate processing part include a method of mounting the substrate (transferred component) on a transfer arm (driven means) and moving the transfer arm by a driving force of a motor (driving means) to thereby transfer the substrate to a desired position. For example, a motor, a pulley, and a belt constitute a moving mechanism at least in the vertical direction and the horizontal direction, the pulley is rotated using the rotational driving force of the motor, and the belt wound around the rotating pulley is moved at least in the vertical direction and the horizontal direction to move the transfer arm coupled to the belt. Thereby, the substrate mounted on the transfer arm can be transferred to the desired position.

Japanese Laid-open Patent Publication No. 2011-42463 discloses, about a stacker vertically moving a tray by driving via the belt, a technique capable of detecting tooth skip of the belt from at least one of the variation in rotation speed of the motor and the position of the tray.

SUMMARY OF THE INVENTION

To improve the throughput of substrate processing, a transfer apparatus for a substrate capable of automatically detecting abnormality at substrate transfer is demanded. Further, a transfer apparatus capable of automatically identifying the cause of the abnormality (failure location) as well as the detection of the abnormality to reduce the time of dealing with the abnormality at the substrate transfer is demanded. Here, the causes of the abnormality include breakage of a coupling transmitting a rotational driving force of the motor and a bearing supporting its rotation shaft, cut (or slip) of the belt, interference and collision of the transfer arm (driven means), and breakage of a guide guiding the transfer arm in a predetermined direction.

The technique disposed in Japanese Laid-open Patent Publication No. 2011-42463 cannot detect abnormality such as the breakage of the coupling, bearing, or guide or the interference of the transfer arm in some cases. For example, when the friction force increases due to the failure of the coupling or the like, the failure cannot be detected in some cases. Further, even when whether abnormality has occurred during transfer can be detected from the variation in rotation speed of the motor and the position of the tray, the cause of the abnormality cannot be identified in some cases.

The present invention has been made under such circumstances and its object is to provide a transfer apparatus and a transfer method capable of detecting abnormality occurring during transfer, when transferring a transferred component by moving a driven means having the transferred component mounted thereon by a rotational driving force of a motor.

According to an aspect of the present invention, a transfer apparatus for mounting and transferring a transferred component on a driven means, the transfer apparatus includes: a driving means for rotating a driving side pulley by a rotational driving force of a motor to move a belt wound around the driving side pulley, thereby moving the driven means coupled to the belt in a predetermined direction; and a transfer monitoring means for monitoring a transfer state of the driven means, wherein the transfer monitoring means detects a torque value of the motor required to move the driven means, calculates a torque differential value of the torque value with respect to time based on the detected torque value, and detects the transfer state using the calculated torque differential value.

According to another aspect of the present invention, a transfer method of mounting and transferring a transferred component on a driven means, the method includes: a transfer monitoring step of monitoring a transfer state of the transferred component; a transferred component mounting step of mounting the transferred component on the driven means; and a driven means moving step of moving the driven means in a predetermined direction by a rotational driving force of a motor, wherein the transfer monitoring step comprises a torque value detection step of detecting a torque value of the motor required to move the driven means, a torque differential value calculation step of calculating a torque differential value of the torque value with respect to time based on the detected torque value, and a transfer state classification step of classifying the transfer state using the calculated torque differential value.

According to the present invention, it is possible to detect abnormality occurring during transfer, when transferring a transferred component by moving a driven means having the transferred component mounted thereon by a rotational driving force of a motor.

DETAILED DESCRIPTION OF THE INVENTION

An unlimited exemplified embodiment of the present invention will be described referring to the accompanying drawings. In illustration in all of the accompanying drawings, the same or corresponding numerals and characters are given to the same or corresponding members or components to omit overlapping description. Further, the drawings are not intended to illustrate relative ratios between the members or components, and therefore their concrete dimensions can be decided by a person skilled in the art referring to the following unlimited embodiment.

The present invention will be described using a transfer apparatus according to the embodiment of the present invention. Note that the present invention can be used also for any other than the embodiment as long as it detects, when transferring a transferred component by moving a driven means having the transferred component mounted thereon, whether the transfer state is normal or abnormal.

(Configuration of Transfer Apparatus)

The configuration of a transfer apparatus 100 according to the embodiment of the present invention will be described using FIG. 1 and FIG. 2.

Figure 1:
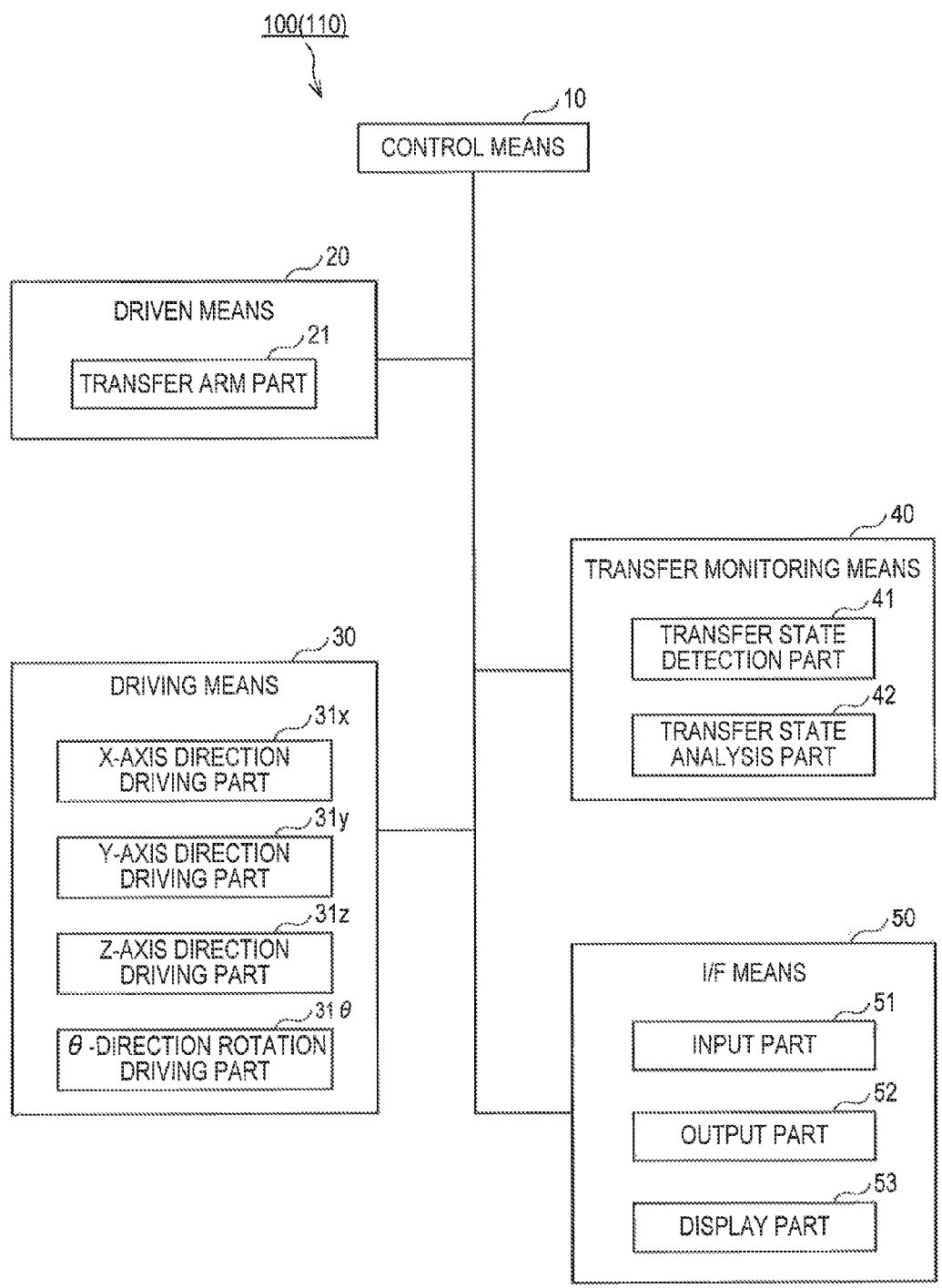
FIG. 1 is a schematic configuration diagram illustrating an example of a transfer apparatus according to an embodiment of the present invention.
Figure 2A:
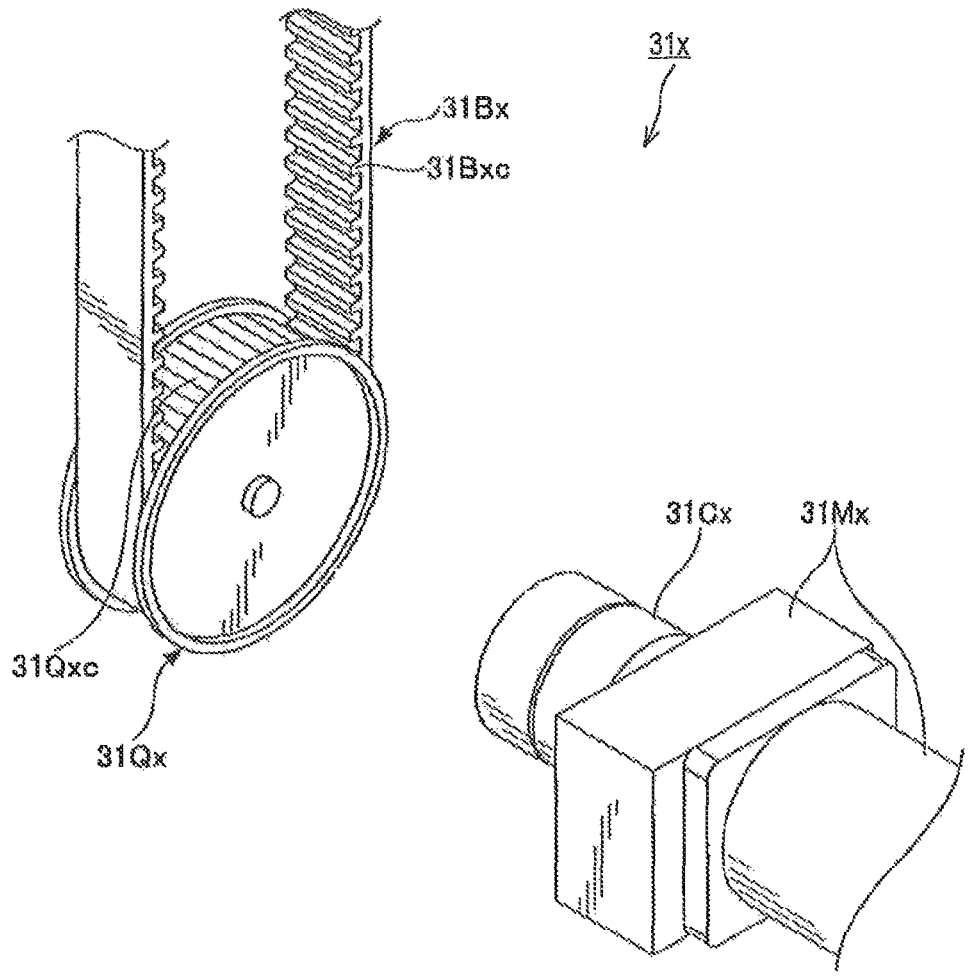
FIG. 2A is an enlarged view of an essential part of a driving means of the transfer apparatus according to the embodiment of the present invention.
Figure 2B:
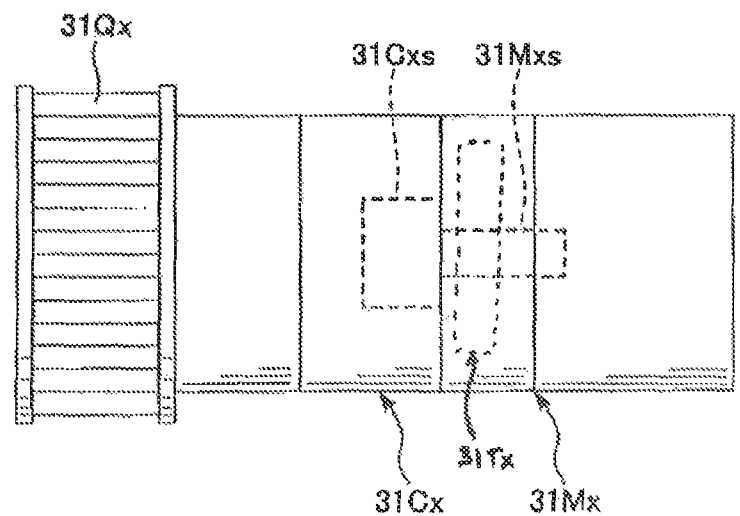
FIG. 2B is a schematic configuration view of the driving means of the transfer apparatus according to the embodiment of the present invention.

FIG. 1 illustrates a schematic configuration diagram of the transfer apparatus 100 according to the embodiment. FIG. 2A illustrates an enlarged view of an essential part of a driving means 30 of the transfer apparatus 100. FIG. 2B illustrates a schematic configuration view of a motor 31Mx and the like of the driving means 30.

As illustrates in FIG. 1, the transfer apparatus 100 according to the embodiment is an apparatus that transfers a transferred component to a desired position by moving a driven means 20 having the transferred component mounted thereon by the driving means 30. Further, the transfer apparatus 100 is an apparatus that detects whether the operation of transfer of the driven means 20 is normal or abnormal (hereinafter, referred to as a "transfer state") during the time when the transferred component is transferred, by a transfer monitoring means 40. Furthermore, the transfer apparatus 100 is an apparatus that outputs the transfer state detected by the transfer monitoring means 40 through an I/F means (interface means) 50.

The transfer apparatus 100 in the embodiment has a control means 10 for instructing respective constituents of the whole transfer apparatus 100 to perform operations and controlling the operations, the driven means 20 for mounting a transferred component thereon, the driving means 30 for moving the driven means 20 in a predetermined direction by a rotational driving force of the motor, and the transfer monitoring means 40 for monitoring the transfer state using a differential value (hereinafter, referred to as a "torque differential value dT") of a torque value T of the motor with respect to time. The transfer apparatus 100 in the embodiment further has the I/F means 50 for inputting the transfer conditions used when the control means 10 performs control and the monitoring conditions used when the state monitoring means 40 monitors the transfer state into the transfer apparatus 100 from the outside of the transfer apparatus 100, and outputting the transfer state detected by the transfer monitoring means 40 and so on to the outside of the transfer apparatus 100.

Here, the transferred component includes a semiconductor wafer, a glass substrate for flat panel display, and other substrates.

The control means 10 is means for instructing respective constituents of the transfer apparatus 100, for example, the transfer monitoring means 40 and so on to perform operations and controlling the operations of the respective constituents. The control means 10 in the embodiment controls the driving means 30 based on the transfer conditions and so on inputted by a later-described input part 51 of the I/F means 50. Further, the control means 10 controls the transfer monitoring means 40 based on the monitoring conditions and so on inputted by the I/F means 50. Furthermore, the control means 10 outputs a monitoring result and so on to later-described output part 52 and display part 53 of the I/F means 50.

The driven means 20 is means for mounting a transferred component to be transferred mounted thereon. The driven means 20 is means moved while having the transferred component mounted thereon, by the driving means 30.

The driving means 30 is means for rotating a driving side pulley by the rotational driving force of the motor to move a belt wound around the rotating driving side pulley, thereby moving the driven means 20 coupled to the moving belt in a predetermined direction. The driving means 30 in the embodiment includes an x-axis direction driving part 31$x$, a y-axis direction driving part 311$y$, a z-axis direction driving part 31$z$, and a θ-direction rotation driving part 31θ that move the driven means 20 in an x-axis direction, a y-axis direction, a z-axis direction, and a θ-direction (rotation direction). Here, the x-axis direction is a direction separating from the transfer apparatus 100 within a plane perpendicular to the vertical direction (for example, an x-axis direction of Example 1 (FIG. 4)). The y-axis direction is a direction perpendicular to the x-axis direction within the plane perpendicular to the vertical direction (for example, a y-axis direction of Example 1 (FIG. 4)). The z-axis direction is a direction perpendicular to the x-axis direction and the y-axis direction (for example, a z-axis direction of Example 1 (FIG. 4)). Further, the θ-direction is a direction of rotation around, as a rotation axis, an axis perpendicular to the plane (xy plane) including the x-axis and the y-axis (for example, a θ-direction of Example 1 (FIG. 4)).

A configuration of the x-axis direction driving part 31$x$ of the transfer apparatus 100 according to the embodiment will be concretely described using FIG. 2.

As illustrated in FIG. 2A and FIG. 2B, the x-axis direction driving part 31$x$ in the embodiment has the motor 31Mx being a power source of driving, a coupling 31Cx transmitting the rotational driving force of the motor 31Mx, a driving side pulley 31Qx rotated by the rotational driving force transmitted from the coupling 31Cx, and a belt (for example, a timing belt) 31Bx wound around the driving side pulley 31Qx.

The x-axis direction driving part 31$x$ rotates the driving side pulley 31Qx by the rotational driving force of the motor 31Mx to move (turn) the belt 31Bx wound around the driving side pulley 31Qx, thereby moving the driven means 20 illustrated in FIG. 1 coupled to the belt 31Bx in a predetermined direction (x-axis direction). In this event, the x-axis direction driving part 31$x$ of the driving means 30 can transfer the transferred component mounted on the driven means 20 in the predetermined direction.

Here, the motor 311Mx and the coupling 31Cx are coupled to each other via a rotation shaft 31Mxs of the motor 31Mx and a rotation shaft 31Cxs of the coupling 31Cx illustrated in FIG. 2B. Further, the driving side pulley 31Qx and the belt 31Bx can move (turn) the belt 31Bx in conjunction with the rotation of the driving side pulley 31Qx by engagement (mesh) of a teeth shape 31Qxc at the outer peripheral portion of the driving side pulley 31Qx and a teeth shape 31Bxc on the inner surface portion of the belt 31Bx in an endless shape illustrated in FIG. 2A.

Figure 5A:
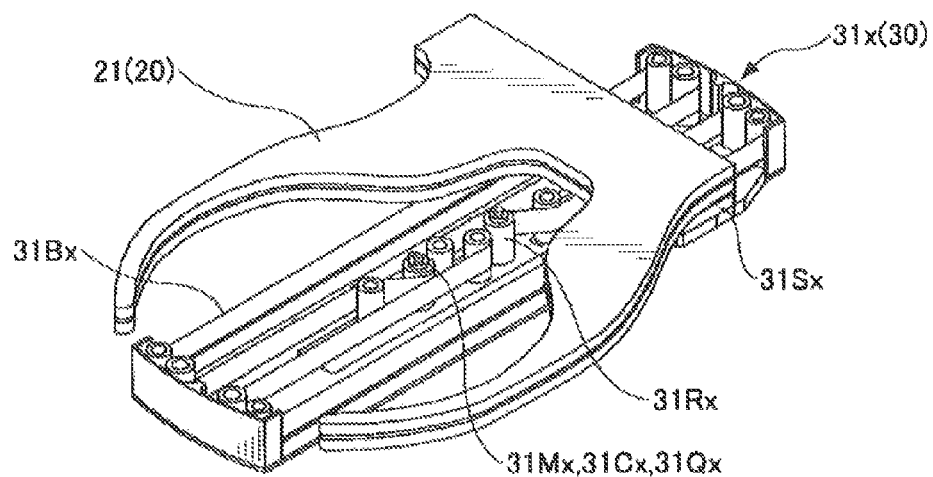
FIG. 5A is a perspective view of an x-axis direction driving part and a transfer arm part of the transfer apparatus according to Example 1 of the present invention.
Figure 5B:
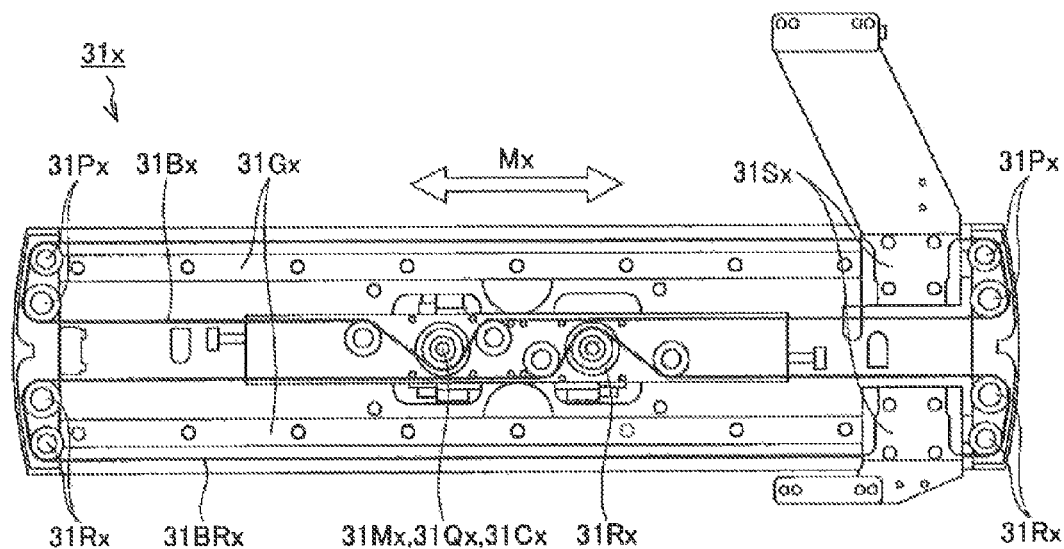
FIG. 5B is a plan view of the x-axis direction driving part of the transfer apparatus according to Example 1 of the present invention.

Further, the x-axis direction driving part 31$x$ has a slider 31Sx, for example, illustrated in FIG. 5B, coupling the driven means 20 and a portion of the belt 31Bx, a guide 31Gx guiding the slider 31Sx in a predetermined direction, a driven side pulley 31Px around which the belt 31Bx is wound and which is rotated according to the movement of the belt 31Bx, a seal side belt 31BRx and a seal side pulley 31Rx arranged at positions facing the driving side pulley 31Qx and so on for waterproof or dustproof of the driving side pulley 31Qx and the belt 31Bx and so on, and a bearing (not illustrated) rotatably supporting the rotation shaft of the driving side pulley 31Qx.

Here, the seal side belt 31BRx moves (turns) according to the movement of the driven means 20. Further, the seal side pulley 31Rx rotates according to the movement of the seal side belt 31 BRx.

The configurations of the y-axis direction driving part 31$y$, the z-axis direction driving part 31$z$, and the θ-direction rotation driving part 31 θ are basically the same as the configuration of the x-axis direction driving part 31$x$, and therefore description thereof will be omitted. Note that in the following description, y, z or θ as a subscript will be added to the numerals and characters of the components of the y-axis direction driving part 31$y$, the z-axis direction driving part 31$z$, and the θ-direction rotation driving part 31θ, as with the x-axis direction driving part 3$x$.

The transfer monitoring means 40 illustrated in FIG. 1 is means for detecting (monitoring) the transfer state using a torque differential value dT of the motor 31Mx. The transfer monitoring means 40 has a transfer state detection part 41 that detects a torque value T and so on of the motor 31Mx, and a transfer state analysis part 42 that analyzes the transfer state based on the detected torque value T and so on.

The transfer state detection part 41 in the embodiment detects the torque value T of the motor 31Mx required to move the driven means 20 and calculates the torque differential value dT based on the detected torque value T. Further, the transfer state detection part 41 detects the rotation operations of the motor 31Mx, the driving side pulley 31Qx, the driven side pulley 31Px, and the seal side pulley 31Rx.

Figure 3A:
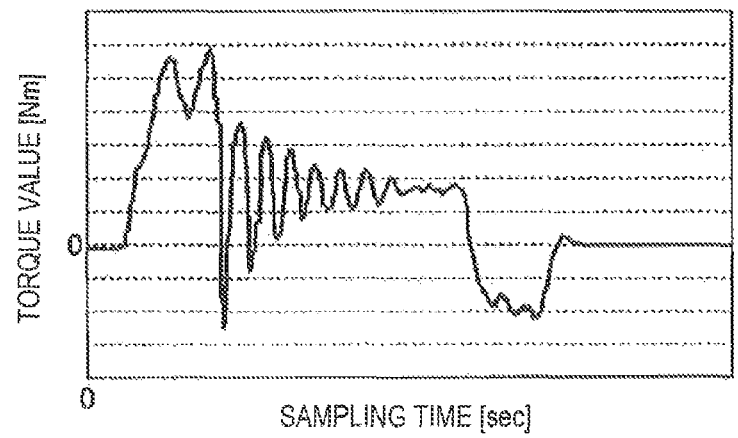
FIG. 3A is an explanatory diagram illustrating an example of a detection result of a torque value at normal time of the transfer apparatus according to the embodiment of the present invention.
Figure 3B:
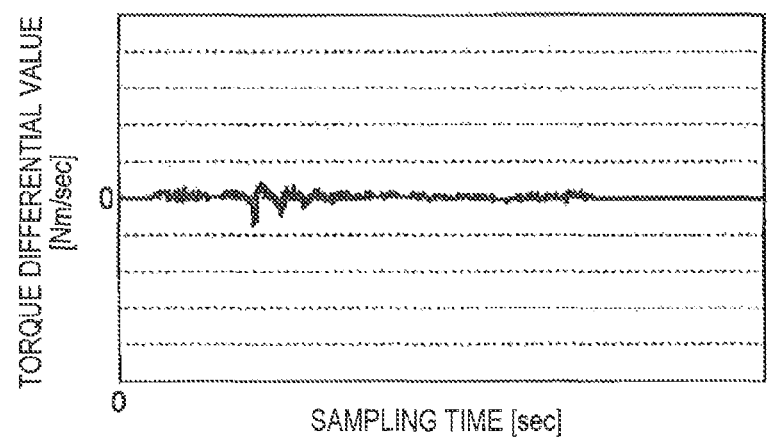
FIG. 3B is an explanatory diagram illustrating an example of a detection result of a torque differential value at normal time of the transfer apparatus according to the embodiment of the present invention.
Figure 3C:
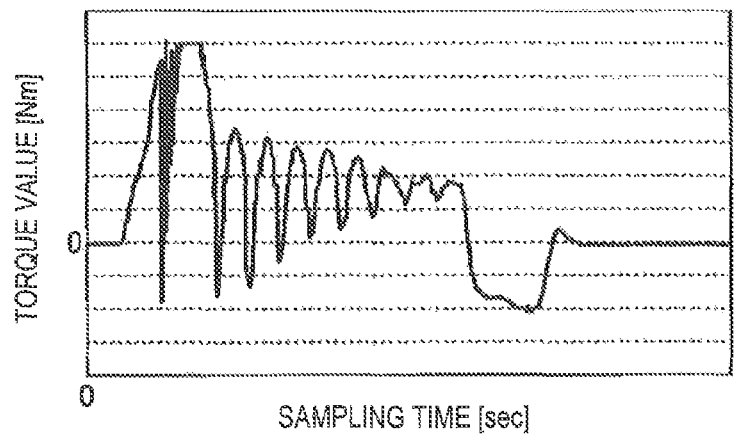
FIG. 3C is an explanatory diagram illustrating an example of a detection result of the torque value at abnormal time of the transfer apparatus according to the embodiment of the present invention.
Figure 3D:
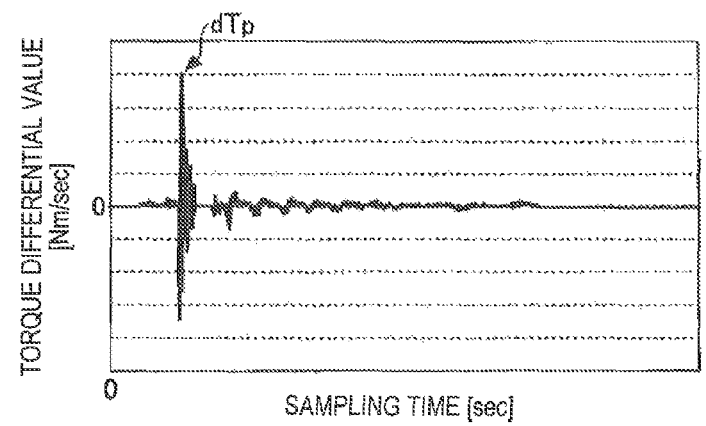
FIG. 3D is an explanatory diagram illustrating an example of a detection result of the torque differential value at abnormal time of the transfer apparatus according to the embodiment of the present invention.

Specifically, the transfer state detection part 41 can detect the torque value in FIG. 3A and the torque differential value in FIG. 3B, for example, when the transfer state is normal, based on a measurement by a torque detector 31Tx installed in the motor 31Mx. Further, the transfer state detection part 41 can detect the torque value in FIG. 3C and the torque differential value in FIG. 3D, for example, when the transfer state is abnormal. Here, as illustrated in FIG. 3D, the value of a peak value dTp of the torque differential value dT of the torque value T of the motor 31Mx required to move the driven means 20 increases when the transfer state is abnormal as compared when the transfer state is normal. In other words, the transfer monitoring means 40 can analyze whether the transfer state is normal or abnormal by detecting (calculating) the value of the peak value dTp of the torque differential value dT by the later-described transfer state analysis part 42.

Further, the transfer state detection part 41 detects an encoder value En (information acquired by an encoder) in each predetermined sampling cycle (predetermined time) by using an encoder (not illustrated) installed in at least one of the motor 31Mx, the driving side pulley 31Qx, the driven side pulley 31Px, and the seal side pulley 31Rx Further, the transfer state detection part 41 can detect the rotation operation of at least one of the motor 31Mx, the driving side pulley 31Qx, the driven side pulley 31Px, and the seal side pulley 31Rx based on the detected encoder value En.

The transfer state analysis part 42 in the embodiment detects the transfer state using the torque differential value dT calculated by the transfer state detection part 41. Further, the transfer state analysis part 42 in the embodiment compares the rotation operations of the motor 311Mx or the driving side pulley 31Qx and the driven side pulley 31Px or the seal side pulley 31Rx based on the detected encoder value En detected by the transfer state detection part 41, and detects the transfer state based on the comparison result. Furthermore, the transfer state analysis part 42 in the embodiment can classify the transfer state into one class or a plurality of classes of the following classes (i) to (vi) based on the detected transfer state.

Here, the classes according to the embodiment are (i) slip (for example, tooth skip) or cut of the belt 31Bx, (ii) breakage of the coupling 31Cx transmitting the rotational driving force, (iii) interference of the driven means 20, (iv) collision of the driven means 20, (v) breakage of the guide 31Gx guiding the driven means 20 in a predetermined direction, and (vi) breakage of the bearing rotatably supporting the rotation shaft rotated by the rotational driving force. Note that the classes according to the present invention are not limited to the above classes.

The transfer state analysis part 42 concretely detects, for example, the peak value dTp in FIG. 10B and an abnormal waveform Tn in FIG. 11B of later-described Example 1, as the slip of the belt 31Bx, using the calculated torque differential value dT, the detected torque value T, and the comparison result of the rotation operations of the motor 31Mx and the driven side pulley 31Px. Further, the transfer state analysis part 42 detects the interference of the driven means 20, for example, as the peak value dTp in FIG. 10B and an abnormal waveform Tn in FIG. 11C, using the calculated torque differential value dT, the detected torque value T, and the comparison result of the rotation operations of the motor and the driven side pulley. Furthermore, the transfer state analysis part 42 detects the cut of the belt 31Bx and the breakage of the coupling 31Cx, for example, as the peak value dTp in FIG. 10B and an abnormal waveform Tn in FIG. 11D, using the calculated torque differential value dT, the detected torque value T, and the comparison result of the rotation operations of the motor 31Mx and the driven side pulley 31Px.

Figure 10A:
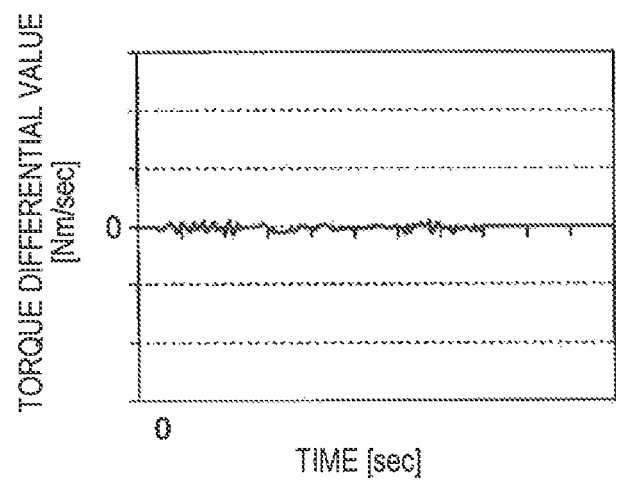
FIG. 10A is an explanatory diagram illustrating an example of a detection result at normal time of a torque differential value of the transfer apparatus according to Example 1 of the present invention.
Figure 10B:
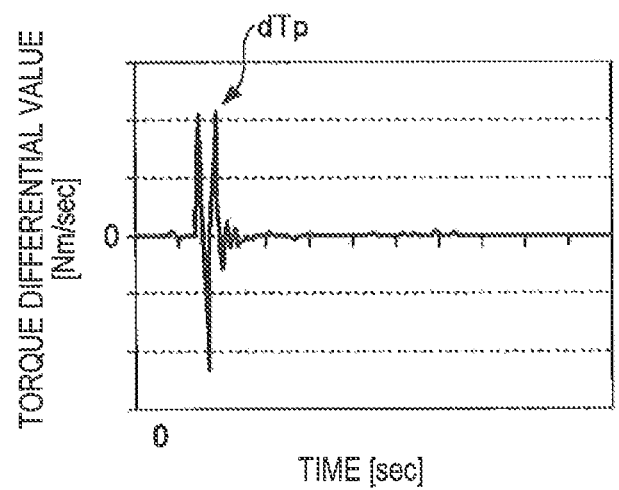
FIG. 10B is an explanatory diagram illustrating an example of the detection result at abnormal time of the torque differential value of the transfer apparatus according to Example 1 of the present invention.
Figure 11A:
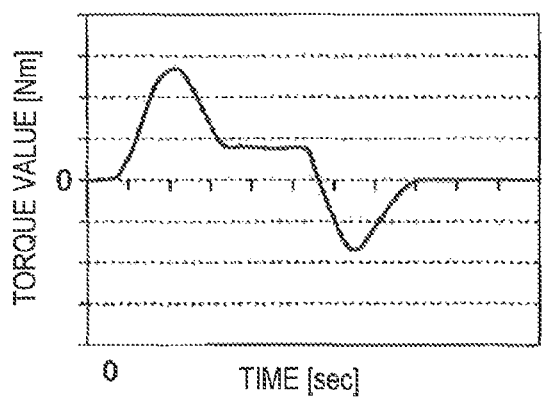
FIG. 11A is an explanatory diagram illustrating an example of a detection result of a torque value at normal time of the transfer apparatus according to Example 1 of the present invention.
Figure 11B:
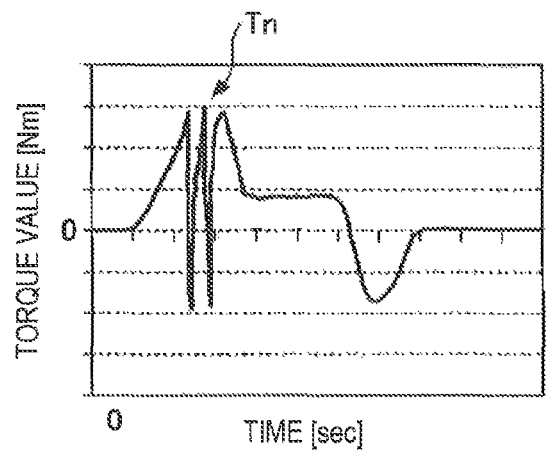
FIG. 11B is an explanatory diagram illustrating an example of the detection result of the torque value at abnormal time of the transfer apparatus according to Example 1 of the present invention.
Figure 11C:
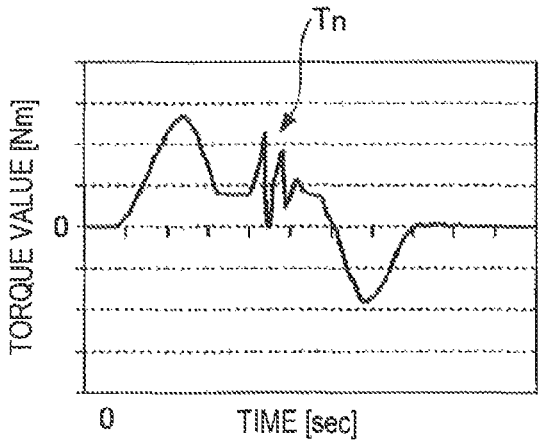
FIG. 11C is an explanatory diagram illustrating an example of the detection result of the torque value at abnormal time of the transfer apparatus according to Example 1 of the present invention.
Figure 11D:
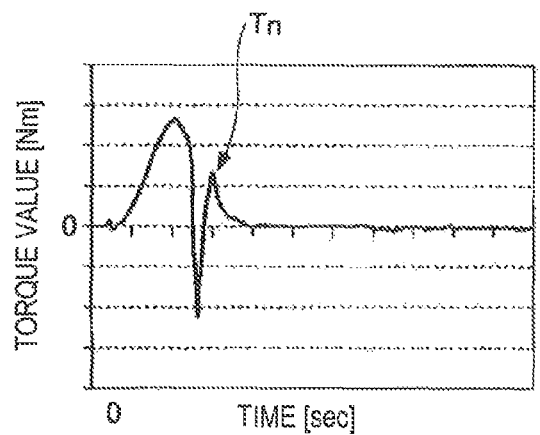
FIG. 11D is an explanatory diagram illustrating an example of the detection result of the torque value at abnormal time of the transfer apparatus according to Example 1 of the present invention.
Figure 11E:
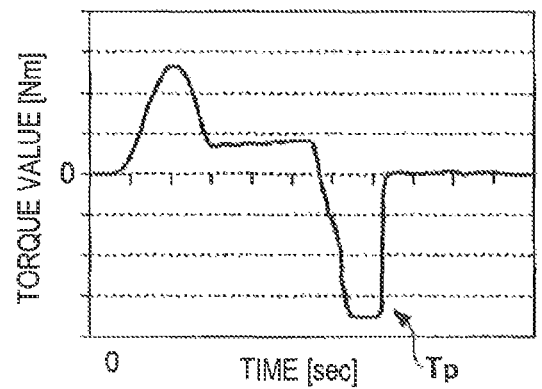
FIG. 11E is an explanatory diagram illustrating an example of the detection result of the torque value at abnormal time of the transfer apparatus according to Example 1 of the present invention.

Further, the transfer state analysis part 42 detects the collision of the driven means 20, for example, as the peak value dTp in FIG. 10B and a peak value Tp in FIG. 11E, using the calculated torque differential val value dT, the detected torque value T, and the comparison result of the rotation operations of the motor 31Mx and the driven side pulley 31Px. Furthermore, the transfer state analysis part 42 detects the breakage of the guide 31Gx and the breakage of the bearing, for example, as the torque differential value dT in FIG. 10A and a peak value Tp in FIG. 11F, using the calculated torque differential value dT, the detected torque value T, and the comparison result of the rotation operations of the motor 31Mx and the driven side pulley 31Px.

Note that the transfer state analysis part 42 may detect the transfer state by comparing the peak value dTp or the like and a predetermined threshold value, using the peak value dTp of the torque differential value dT calculated by the transfer state detection part 41, the peak value Tp of the torque value T, or the abnormal waveform Tn. Further, the transfer state analysis part 42 may detect the transfer state using the comparison result of the rotation operations of the driving side pulley 31Qx and the driven side pulley 31Px. Alternatively, the transfer state analysis part 42 may detect the transfer state using the comparison result of the rotation operations of the motor 31Mx and the seal side pulley 31Rx.

Here, the predetermined threshold value can be a value corresponding to the weight and the transfer conditions of the transferred component and the specifications of the transfer apparatus 100. Alternatively, the predetermined threshold value can be a value determined in advance by an experiment and numerical calculation and so on.

Further, the transfer state analysis part 42 can output, as the monitoring result, information on the class corresponding to the detected transfer state to the later-described I/F means 50. Note that though the case of the x-axis direction driving part 31x has been described in the above description of the transfer monitoring means 40, the description of the x-axis direction driving part 31x also applies to the case of the y-axis direction driving part 31y, the z-axis direction driving part 31z, and the θ-direction rotation driving part 31 θ.

The I/F means 50 is an information transmission means or an information communication means for inputting and outputting information from/to the outside of the transfer apparatus 100. The I/F means 50 in the embodiment has the input part 51 that inputs detection conditions, transfer conditions, and monitoring conditions from the outside to the transfer apparatus 100, the output part 52 that outputs a detection result, a calculation result, and a monitoring result to the outside of the transfer apparatus 100, and the display part 53 that displays the detection result, the calculation result, and the monitoring result. Note that as the I/F means 50, a publicly-known technique can be used.

The present invention will be described using transfer apparatuses according to examples.

EXAMPLE 1

(Configuration of Transfer Apparatus)

Figure 4:
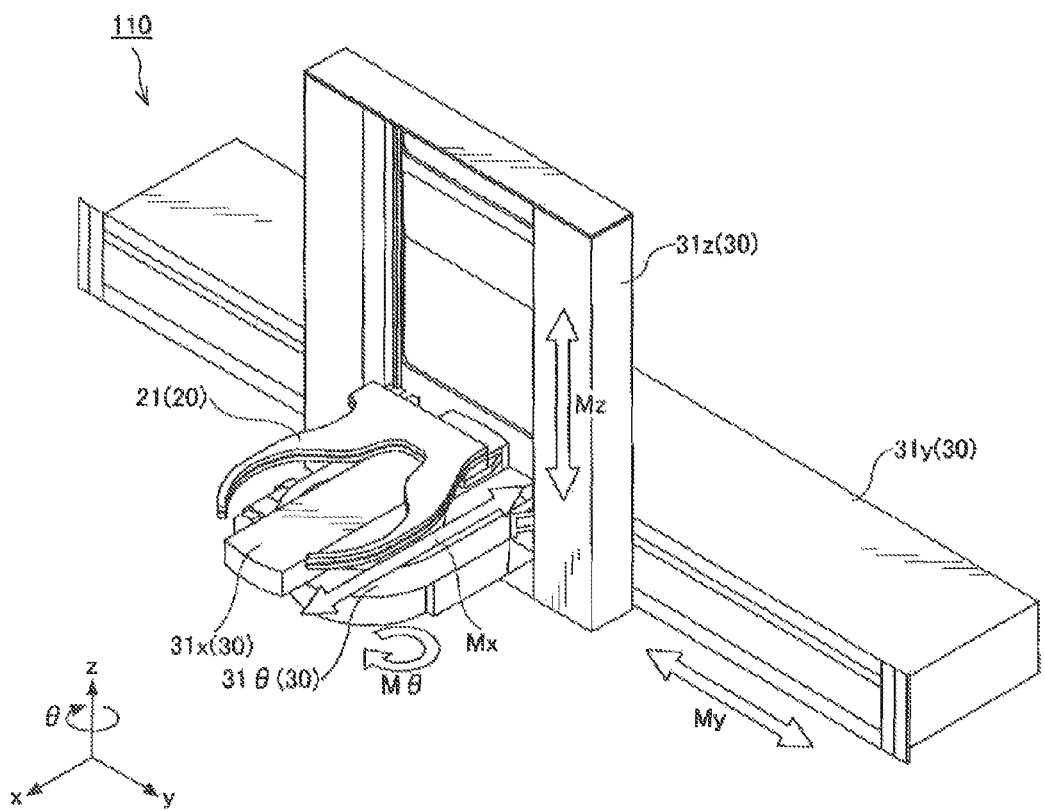
FIG. 4 is a perspective view (schematic external view) illustrating an example of the transfer apparatus according to Example 1 of the present invention.
Figure 6A:
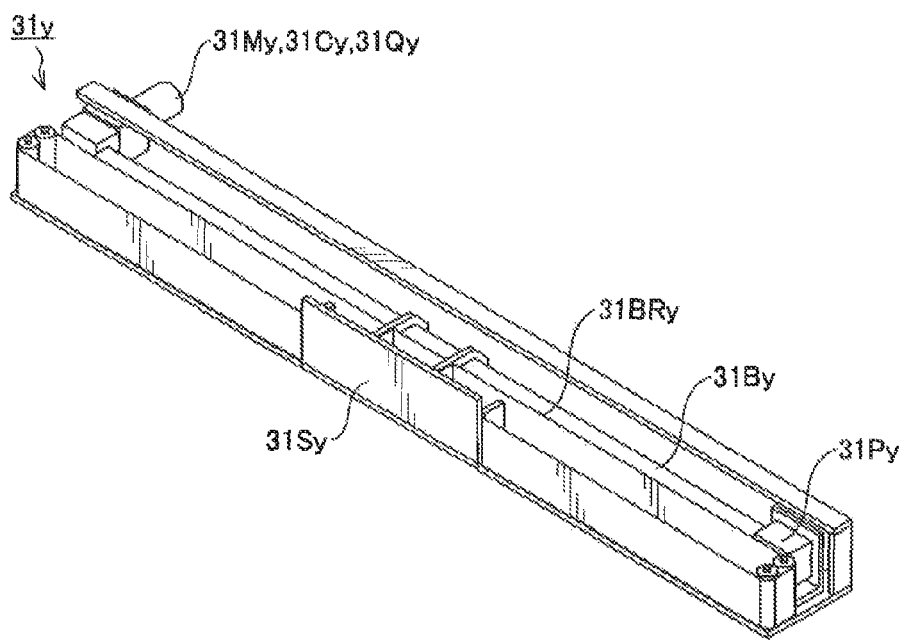
FIG. 6A is a perspective view of a y-axis direction driving part of the transfer apparatus according to Example 1 of the present invention.
Figure 6B:
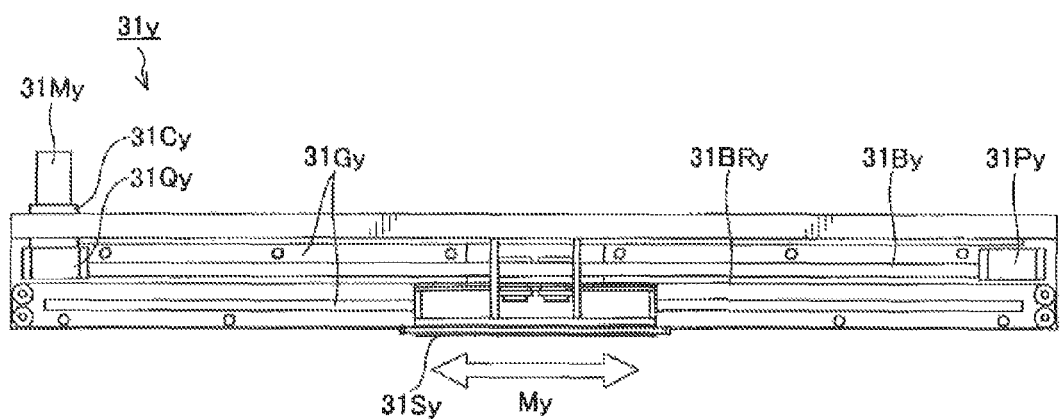
FIG. 6B is a plan view of the y-axis direction driving part of the transfer apparatus according to Example 1 of the present invention.
Figure 7A:
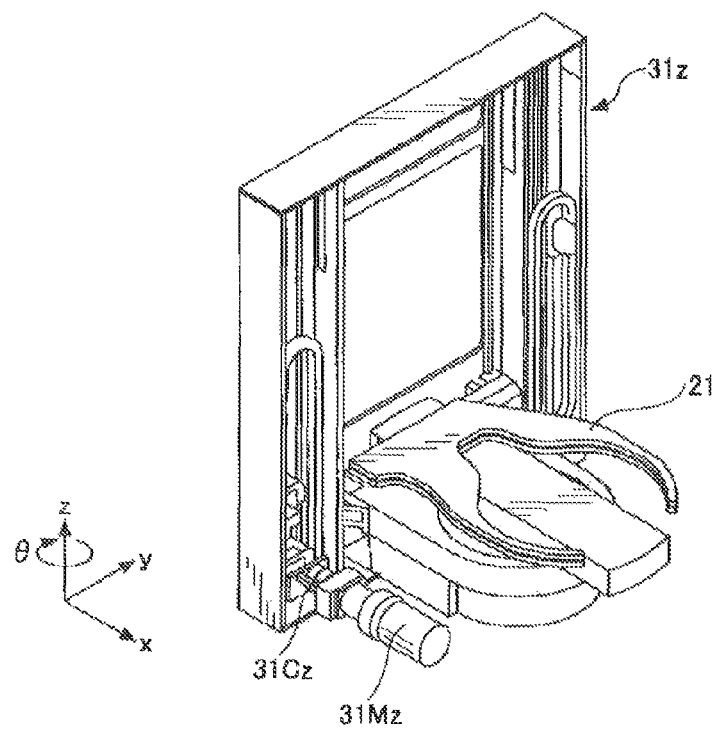
FIG. 7A is a perspective view of a z-axis direction driving part of the transfer apparatus according to Example 1 of the present invention.
Figure 7B:
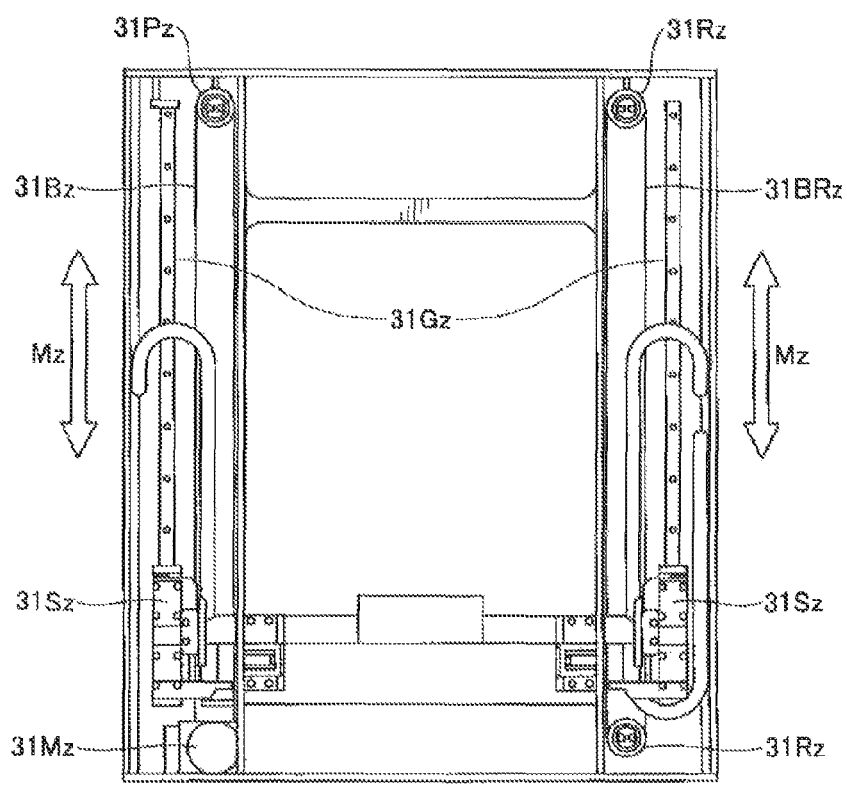
FIG. 7B is a plan view of the z-axis direction driving part of the transfer apparatus according to Example 1 of the present invention.
Figure 8:
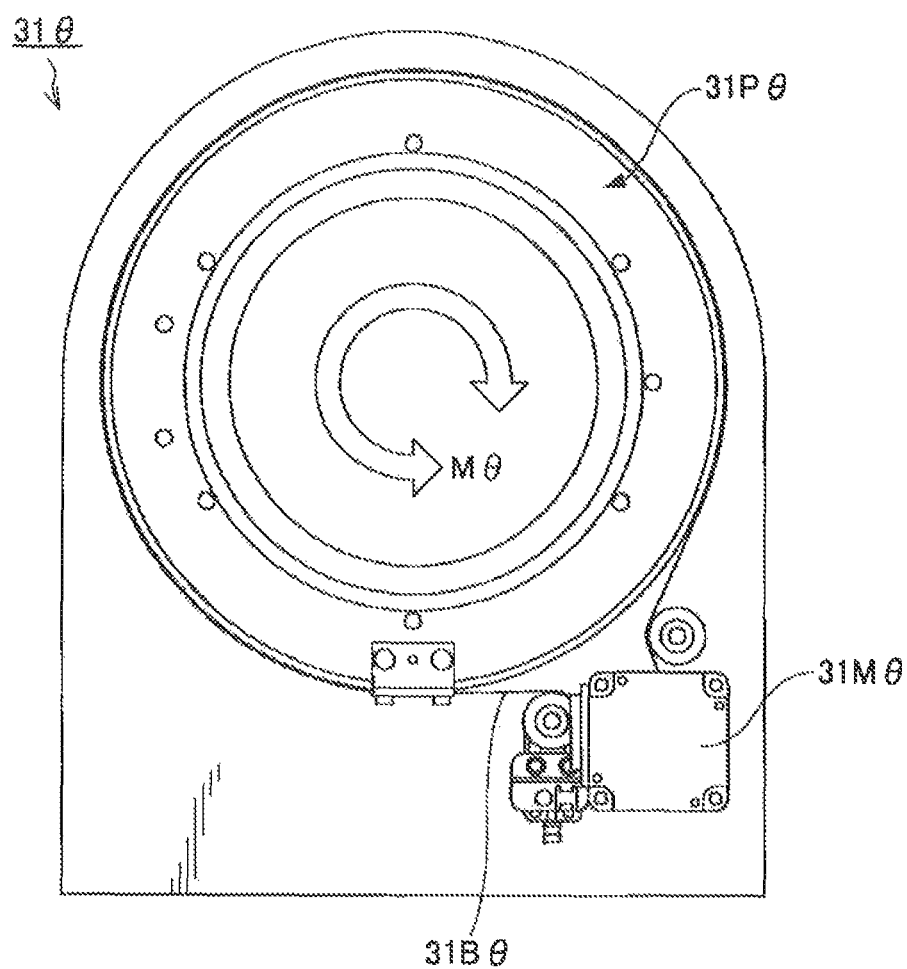
FIG. 8 is a plan view of a θ-direction rotation direction driving part of the transfer apparatus according to Example 1 of the present invention.

A configuration of a transfer apparatus 110 according to Example 1 of the present invention will be described using FIG. 1 and FIG. 4 to FIG. 8. FIG. 4 is a perspective view of the transfer apparatus 110 according to this example. FIG. 5A and FIG. 5B are a perspective view and a plan view of an x-axis direction driving part 31x of a driving means 30 and a transfer arm part 21 of a driven means 20 of the transfer apparatus 110. FIG. 6A and FIG. 6B are a perspective view and a plan view of a y-axis direction driving part 31y of the transfer apparatus 110. FIG. 7A and FIG. 7B are a perspective view and a plan view of a z-axis direction driving part 31z of the transfer apparatus 110. FIG. 8 is a plan view of a θ-direction rotation driving part 31 θ of the transfer apparatus 110.

Note that the configuration of the transfer apparatus 110 according to this example is basically the same as the configuration of the transfer apparatus 100 in the above-described embodiment, and therefore different points will be described in the following description.

As illustrated in FIG. 4, the transfer apparatus 110 according to this example is an apparatus that transfers a transferred component to a desired position by moving the driven means 20 having the transferred component mounted thereon by the driving means 30. The transfer apparatus 110 in this example can move the driven means 20 in the x-axis direction, the y-axis direction, the z-axis direction, and the θ-direction by the driving means 30. Thus, the transfer apparatus 110 can transfer the transferred component mounted on the driven means 20 in the x-axis direction, the y-axis direction, the z-axis direction, and the θ-direction (Mx-, My-, Mz-, M θ-directions in the drawing).

The driven means 20 in this example has the transfer arm part 21 that includes a pick part that can mount two substrates thereon. Note that the driven means 20 in this example is not limited to the transfer arm part 21 in this example.

As illustrated in FIG. 5A and FIG. 5B, the x-axis direction driving part 31x in this example has a motor 31Mx being the power source of driving, a coupling 31Cx transmitting a rotational driving force of the motor 31Mx, a driving side pulley 31Qx rotated by the rotational driving force transmitted from the coupling 31Cx, and a belt Bx wound around the driving side pulley 31Qx. Further, the x-axis direction driving part 31x has a slider 31Sx that couples the driven means 20 and a portion of the belt 31Bx, a guide 31Gx guiding the slider 31Sx in a predetermined direction (the x-direction for the x-axis direction driving part 31x), a driven side pulley 31Px around which the belt 31Bx is wound and which is rotated according to the movement of the belt 31Bx, a seal side belt 31BRx moving (turning) according to the movement of the driven means 20, and a seal side pulley 31Rx rotating according to the movement of the seal side belt 31BRx.

The configurations of the y-axis direction driving part 31y, the z-axis direction driving part 31z, and the θ-direction rotation driving part 31 θ in FIG. 6, FIG. 7, and FIG. 8 are basically the same as the configuration of the x-axis direction driving part 31x, and therefore description thereof will be omitted.

(Transferring Operation)

A transfer method (driven means moving step) of the transfer apparatus 110 according to this example will be concretely described using FIG. 5 to FIG. 8.

At the beginning, as illustrated in FIG. 5A and FIG. 5B, the transfer apparatus 110 rotates the driving side pulley 31Qx by the rotational driving force of the motor 311Mx of the x-axis direction driving part 31x (driving side pulley rotation step) to move the belt 31Bx wound around the driving side pulley 31Qx (belt moving step) in order to transfer the transferred component in the x-axis direction (the Mx-direction in the drawing). In this event, the x-axis direction driving part 31x moves the driven means 20 coupled to the belt 31Bx in the x-axis direction. Further, the x-axis direction driving part 31x rotates the driven side pulley Px according to the movement of the belt 31Bx (driven side pulley rotation step). Thereby, the transfer apparatus 110 can transfer the transferred component mounted on the driven means 20 in the x-axis direction.

Next, as illustrated in FIG. 6A and FIG. 6B, the transfer apparatus 110 moves the driven means 20 in the y-axis direction by the same operation as that of the transfer in the x-axis direction, by a motor 31My of the y-axis direction driving part 31y in order to transfer the transferred component in the y-axis direction (the My-direction in the drawing). Thereby, the transfer apparatus 110 can transfer the transferred component mounted on the driven means 20 in the y-axis direction.

Further, as illustrated in FIG. 7A and FIG. 7B, the transfer apparatus 110 moves the driven means 20 in the z-axis direction by the same operation as that of the transfer in the x-axis direction, by a motor 31Mz of the z-axis direction driving part 31z in order to transfer the transferred component in the z-axis direction (the Mz-direction in the drawing). Thereby, the transfer apparatus 110 can transfer the transferred component mounted on the driven means 20 in the z-axis direction.

The transfer apparatus 110 further rotates the driving side pulley 31Q θ (not illustrated) by the rotational driving force of a motor 31M θ of the θ-direction rotation driving part 31 θ (driving side pulley rotation step) to move the belt 31B θ wound around the driving side pulley 31Q θ (belt moving step) in order to transfer (rotate) the transferred component in the θ-direction (the M θ-direction in the drawing). In this event, the θ-direction rotation driving part 31 θ can rotate the driven side pulley 31P θ coupled to the belt 31B θ and the driven means 20 coupled to the driven side pulley 31P θ in the θ-direction (driven side pulley rotation step). Thereby, the transfer apparatus 110 can transfer the transferred component mounted on the driven means 20 in the θ-direction.

Note that the order of the transfer in the x-axis direction, the y-axis direction, the z-axis direction, and the θ-direction is not limited to the above. More specifically, the transfer apparatus 110 can transfer the transferred component in an arbitrary transfer direction at an arbitrary timing by the x-axis direction driving part 31x, the y-axis direction driving part 31y, the z-axis direction driving part 31z, and the θ-direction rotation driving part 31 θ.

(Operation of Monitoring Transfer State)

Figure 9:
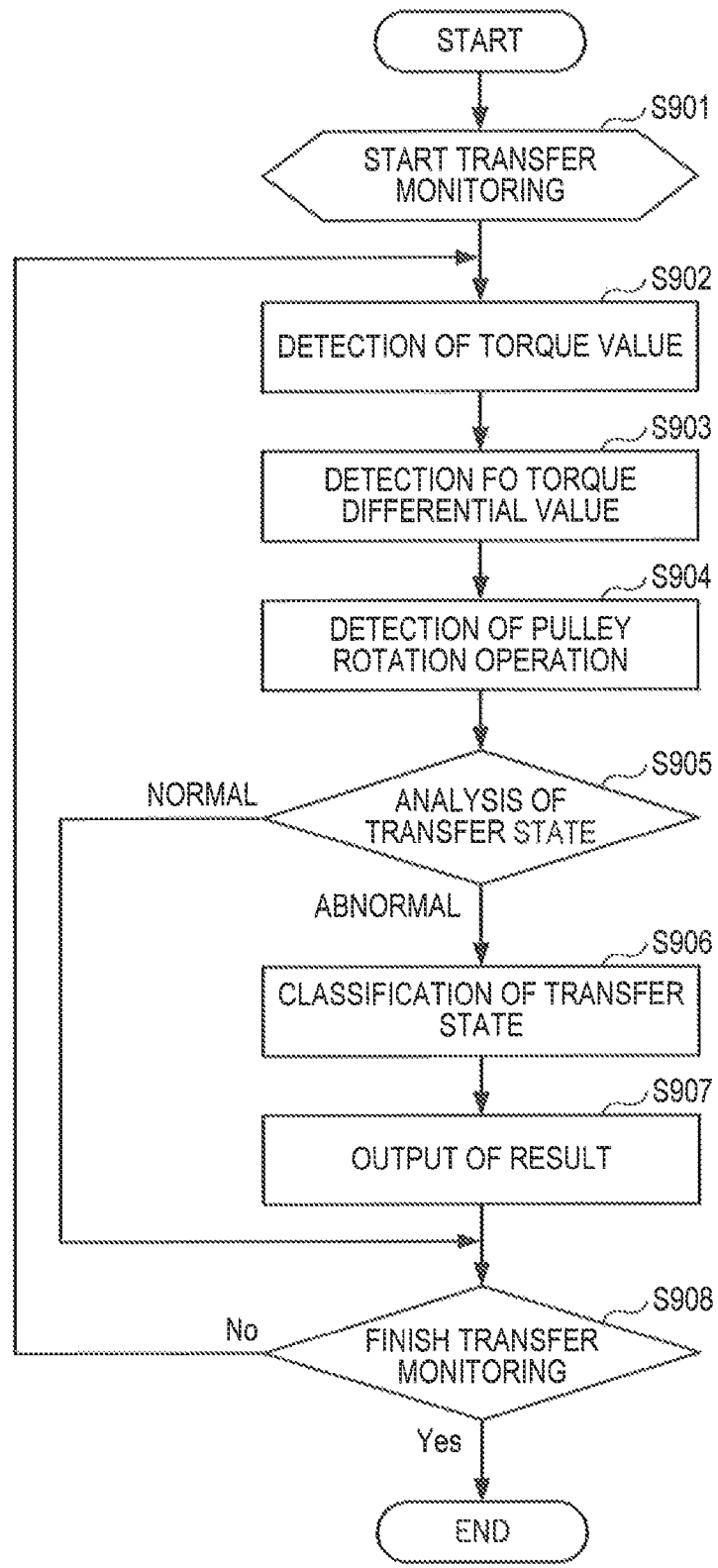
FIG. 9 is a flowchart for explaining an operation of monitoring the transfer state of the transfer apparatus according to Example 1 of the present invention.

The transfer method of monitoring the transfer state when the transfer apparatus 110 according to Example 1 of the present invention transfers the transferred component (transfer monitoring step) will be described using FIG. 9 to FIG. 11. FIG. 9 is a flowchart of the transfer method of monitoring the transfer state of the transfer apparatus 110 according to this example. FIG. 10A and FIG. 10B illustrate a detection result at normal time and a detection result at abnormal time of a torque differential value of the transfer apparatus 110. FIG. 11A illustrates an example of a detection result of a torque value at normal time of the transfer apparatus 110, and FIGS. 11B to 11F illustrate examples of detection results of the torque value at abnormal time of the transfer apparatus 110.

As illustrated in FIG. 9, at Step S901, the transfer apparatus 110 according to this example first starts to monitor the transfer state by the control of the control means 10 based on the information inputted by the input part 51 of the interface means 50 and so on. The transfer apparatus 110 further mounts a transferred component on the driven means 20 (transferred component mounting step). Then, the transfer apparatus 110 proceeds to Step S902.

Then, at Step S902, the transfer apparatus 110 moves the driven means 20 in predetermined directions (the x-axis direction, the y-axis direction, the z-axis direction, and the θ-direction) by the rotational driving forces of the motors 31Mx, 31My, 31Mz, 31M θ (driven means moving step). In this event, the transfer apparatus 110 detects the torque values T of the motors 31Mx, 31My, 31Mz, 31M θ required to move the driven mean 20 (torque value detection step). After the detection, the transfer apparatus 110 proceeds to Step S903.

Then, at Step S903, the transfer apparatus 110 calculates (detects) the torque differential values dT based on the detected torque values T by the transfer state detection part 41

(torque differential value detection step). After the calculation, the transfer apparatus 110 proceeds to Step S904.

At Step S904, the transfer apparatus 110 detects the rotation operations of the motors 31Mx, 31My, 31Mz, 31M θ or the driving side pulleys 31Qx, 31Qy, 31Qz, 31Q θ and the driven side pulleys 31Px, 31Py, 31Pz, 31P θ by the transfer state detection part 41. The transfer apparatus 110 may further detect the rotation operations of the seal side pulleys 311Rx, 31Ry, 31R, 31R θ by the transfer state detection part 41 (seal side pulley rotation detection step). After the detection, the transfer apparatus 110 proceeds to step S905.

At Step S905, the transfer apparatus 110 analyzes the transfer state by the transfer state analysis part 42 of the transfer monitoring means 40 to determine whether the transfer state is normal or abnormal.

Specifically, the transfer apparatus 110 determines, by the transfer state analysis part 42, whether the transfer state is normal or abnormal based on the torque differential value dT and the torque value T calculated by the transfer state detection part 41. Here, the torque differential value dT and the torque value T at normal time are as illustrated in FIG. 10A and FIG. 11A. The transfer state analysis part 42 can determine whether the transfer state is normal or abnormal by comparing the torque differential value dT and the torque value T detected by the transfer state detection part 41 with the torque differential value dT and the torque value T at normal time which have been stored in advance. Note that the transfer state analysis part 42 may determine whether the transfer state is normal or abnormal using the peak value dTp of the torque differential value dT illustrated, for example, in FIG. 10B calculated by the transfer state detection part 41, the peak value Tp of the torque value T illustrated, for example, in FIG. 11F, or the abnormal waveform Tn illustrated, for example, in FIG. 11B.

The transfer apparatus 110 can further compare the rotation operations of the motor 31Mx, 31, 31My, 31Mz, 31M θ or the driving side pulley 31Qx, 31Qy, 31Qz, 31Q θ and the driven side pulley 31Px, 31Py, 31Pz, 31P θ and determine whether the transfer state is normal or abnormal additionally using the comparison result, by the transfer state analysis part 42. Here, the transfer apparatus 110 may compare, by the transfer state analysis part 42, the rotation operations of the motor 31Mx, 31My, 31Mz, 31M θ or the driving side pulley 31Qx, 31Qy, 31Qz, 31Q θ and the seal side pulley 31Rx, 31Ry, 31Rz, 31R θ. In this event, the transfer state analysis part 42 can determine that the transfer state is abnormal when the difference between the rotation operations of the motor 31Mx, 31My, 31Mz, 31M θ or the like and the driven side pulley 31Px, 31Py, 31Pz, 31P θ or the like is equal to or more than a predetermined difference. Note that the predetermined difference can be a value corresponding to the weight and the transfer conditions of the transferred component and the specifications of the transfer apparatus. Further, the predetermined difference can be a value that has been decided in advance by an experiment and numerical calculation and so on.

Then, the transfer apparatus 110 proceeds to Step S908 when determining that the transfer state is normal. The transfer apparatus 110 proceeds to Step S906 when determining that the transfer state is abnormal.

Then, at Step S906, the transfer apparatus 110 identifies the cause of abnormality of the transfer state and classifies the transfer state (transfer state classification step).

Specifically, the transfer apparatus 110 can identify the cause of the abnormality of the transfer state based on the torque differential value dT illustrated in FIG. 10B and the torque values T illustrated in FIGS. 11B to 11F calculated by the transfer state detection part 41 and classify the transfer state, by the transfer state analysis part 42. The transfer apparatus 110 can further identify the cause of the abnormality of the transfer state and classify the transfer state using the comparison result of comparing the rotation operation of the motor 31Mx, 31My, 31Mz, 31M θ and the rotation operation of the driven side pulley 31Px, 31Py, 31Pz, 31P θ by the transfer state analysis part 42. Examples of the result (monitoring result) of the transfer state classified by the transfer apparatus 110 are illustrated in Table 1.

TABLE 1

| | Torque differential value monitoring | Torque value monitoring | Driven means initializing operation | Comparison of rotation operations of motor and driven side pulley |
|---|---|---|---|---|
| Belt slip | dTp (FIG. 10B) | Tn (FIG. 11B) | possible | different |
| Driven means interference | dTp (FIG. 10B) | Tn (FIG. 11C) | possible | not different |
| Belt cut Coupling breakage | dTp (FIG. 10B) | Tn (FIG. 11D) | impossible | different |
| Driven means collision | dTp (FIG. 10B) | Tp (FIG. 11E) | possible | not different |
| Guide breakage Bearing breakage | dT (FIG. 10A) | Tp (FIG. 11F) | possible | not different |

As illustrated in Table 1, the transfer state analysis part 42 can classify the transfer state into a class corresponding to any one of the slip and the cut of the belt 31Bx, 31By, 31Bz, 31B θ, the breakage of the coupling 31Cx, 31Cy, 31Cz, 31C θ, the interference and the collision of the driven means 20, the breakage of the guide 31Gx, 31Gy, 31Gz, 31G θ, and the breakage of the bearing, using the above-described torque differential value dT, the torque value T, and the comparison result of the rotation operations.

Specifically, the transfer apparatus 110 in this example can identify, by the transfer state analysis part 42, "slip (or tooth skip) of the belt" as the cause of the abnormality of the transfer state in the case where the peak value dTp of the torque differential value dT and the abnormal waveform Tn of the torque value T become as those in FIG. 10B and FIG. 11B and when the difference between the rotation operations of the motor 31Mx, 31My, 31Mz, 31M θ and the driven side pulley 31Px, 31Py, 31Pz, 31P θ becomes equal to or more than the predetermined difference. At this time, the transfer apparatus 110 can classify the transfer state as "abnormal" due to "slip (or tooth skip) of the belt" by the transfer state analysis part 42.

Similarly, the transfer apparatus 110 can identify "interference of the driven means 20" as the cause of the abnormality of the transfer state in the case where the peak value dTp of the torque differential value dT and the abnormal waveform Tn of the torque value T become as those in FIG. 10B and FIG. 11C and when the difference between the rotation operations of the motor 31x, 31My, 31Mz, 31M θ and the driven side pulley 31Px, 31Py, 31Pz, 31P θ becomes less than the predetermined difference. At this time, the transfer apparatus 110 can classify the transfer state as "abnormal" due to "interference of the driven means" by the transfer state analysis part 42.

Further, the transfer apparatus 110 can identify "cut of the belt and breakage of the coupling" as the cause of the abnormality of the transfer state in the case where the peak value dTp of the torque differential value dT and the abnormal waveform Tn of the torque value T become as those in FIG.

10B and FIG. 11D and when the difference between the rotation operations of the motor 31Mx, 31My, 31Mz, 31M θ and the driven side pulley 31Px, 31Py, 31Pz, 31P θ becomes equal to or more than the predetermined difference. At this time, the transfer apparatus 110 can classify the transfer state as "abnormal" due to "cut of the belt and breakage of the coupling" by the transfer state analysis part 42.

Further, the transfer apparatus 110 can identify "collision of the driven means" as the cause of the abnormality of the transfer state in the case where the peak value dTp of the torque differential value dT and the peak value Tp of the torque value T become as those in FIG. 10B and FIG. 11E and when the difference between the rotation operations of the motor 31Mx, 31My, 31Mz, 31M θ and the driven side pulley 31Px, 31Py, 31Pz, 31P θ becomes less than the predetermined difference. At this time, the transfer apparatus 110 can classify the transfer state as "abnormal" due to "collision of the driven means" by the transfer state analysis part 42.

Figure 11F:
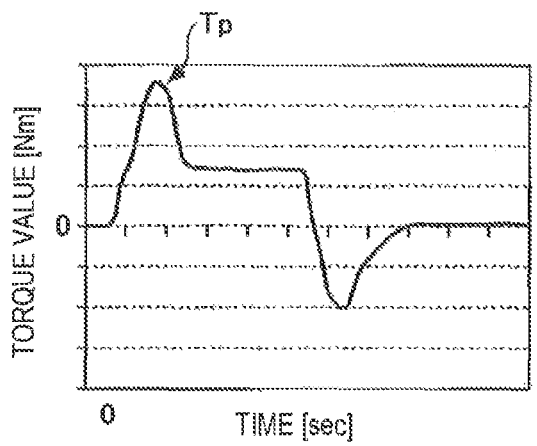
FIG. 11F is an explanatory diagram illustrating an example of the detection result of the torque value at abnormal time of the transfer apparatus according to Example 1 of the present invention.

Further, the transfer apparatus 110 can identify "breakage of the guide and breakage of the bearing" as the cause of the abnormality of the transfer state in the case where the torque differential value dT and the peak value Tp of the torque value T become as those in FIG. 10A and FIG. 11F and when the difference between the rotation operations of the motor 31Mx, 31My, 31Mz, 31M θ and the driven side pulley 31Px, 31Py, 31Pz, 31P θ becomes less than the predetermined difference. At this time, the transfer apparatus 110 can classify the transfer state as "abnormal" due to "breakage of the guide and breakage of the bearing" by the transfer state analysis part 42.

After the classification operation is finished, the transfer apparatus 110 proceeds to Step S907.

Then, at Step S907, the transfer apparatus 110 outputs the result (the result of classification by the transfer state analysis part 42 and the like) of detecting the transfer state by the transfer monitoring means 40 to at least one of the output part 52 and the display part 53 of the I/F means 50. Upon completion of the output, the transfer apparatus 110 proceeds to Step S908. Note that the transfer apparatus 110 may output information about the transfer state for alarm to at least one of the output part 52 and the display part 53 based on the detection results at Steps S902 to S904 in order to prevent the transfer state from becoming abnormal.

At Step S908, the transfer apparatus 110 determines by the control means 10 whether to finish the operation of monitoring the transfer state. More specifically, the control means 10 determines whether to finish the monitoring of the transfer state based on the monitoring conditions and so on inputted by the input part 51 of the I/F means 50. When finishing the monitoring, the transfer apparatus 110 proceeds to END in FIG. 9. When continuing the monitoring, the transfer apparatus 110 returns to Step S902.

With the above, the transfer apparatus 110 according to Example 1 of the present invention can detect the differential values of the torque values of the motors 31Mx, 31My, 31Mz, 31M θ required to move the driven means when transferring the transferred component by moving the driven means having the transferred component mounted thereon by the rotational driving forces of the motors 31Mx, 31My, 311Mz, 31M θ, and therefore can detect the abnormality occurring during the transfer using the detected torque differential values. Further, the transfer apparatus 110 according to this example can use the comparison result of comparing the rotation operations of the motors 31Mx, 31My, 31Mz, 31M θ or the like and the rotation operations of the driven side pulley 31Px, 31Py, 31Pz, 31P θ or the like, and therefore can detect the abnormality occurring during the transfer. Furthermore, the transfer apparatus 110 according to this example can classify the transfer state into one class or a plurality of classes of (i) slip or cut of the belt, (ii) breakage of the coupling transmitting the rotational driving force, (iii) interference of the driven means, (iv) collision of the driven means, (v) breakage of the guide guiding the driven means in a predetermined direction, and (vi) breakage of the bearing rotatably supporting the rotation shaft rotated by the rotational driving force.

EXAMPLE 2

(Configuration of Transfer Apparatus)

Figure 12:
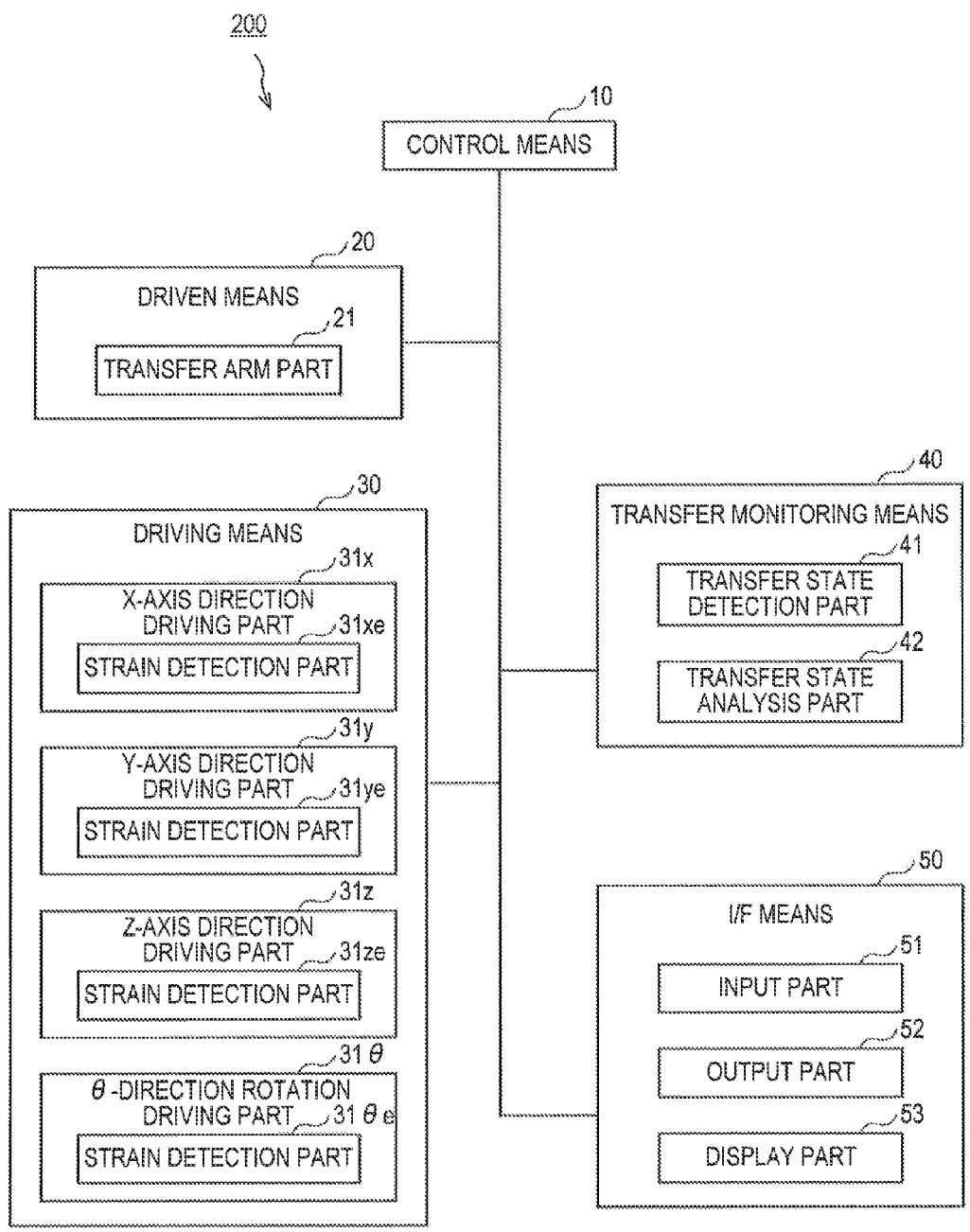
FIG. 12 is a schematic configuration diagram illustrating an example of a transfer apparatus according to Example 2 of the present invention.
Figure 13A:
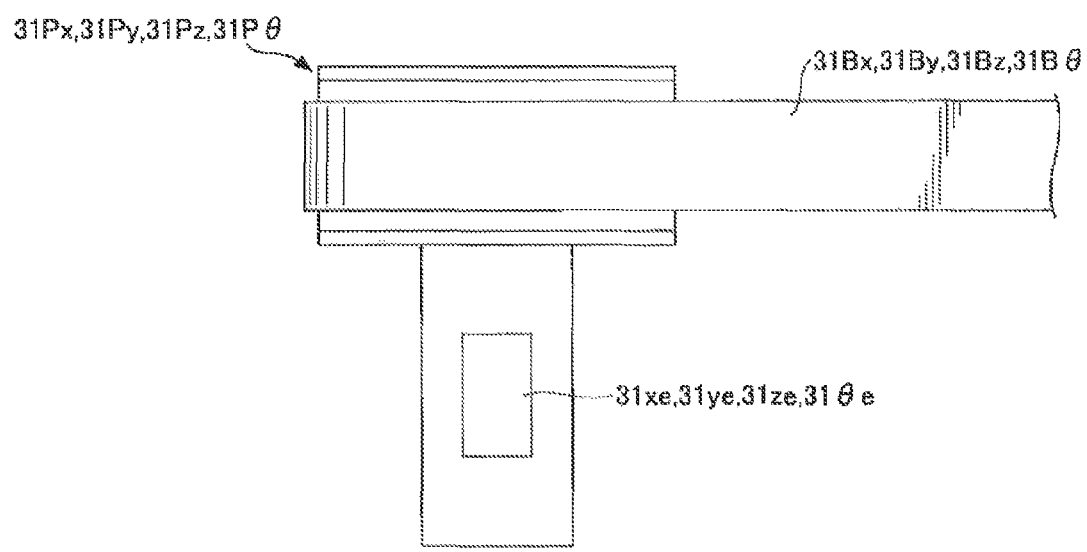
FIG. 13A is a schematic view illustrating an example of a strain detection part when the transfer state of the transfer apparatus according to Example 2 of the present invention is normal.
Figure 13B:
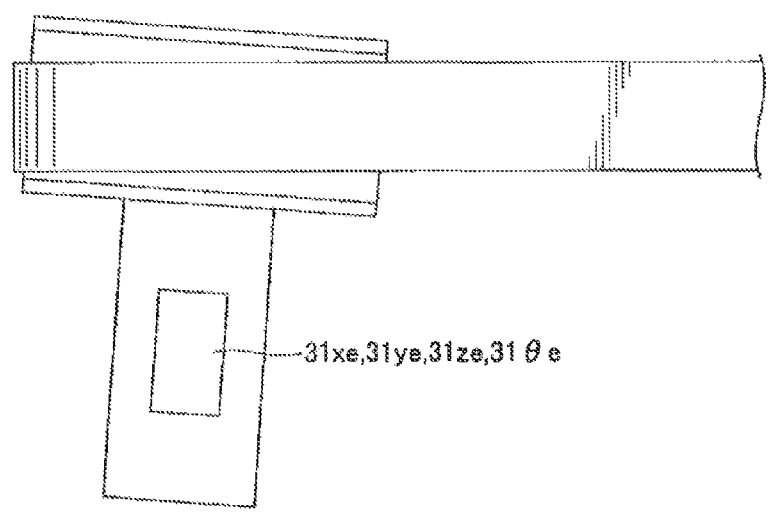
FIG. 13B is a schematic view illustrating an example of the strain detection part when the transfer state of the transfer apparatus according to Example 2 of the present invention is abnormal.

A configuration of a transfer apparatus 200 according to Example 2 of the present invention will be described using FIG. 12 and FIG. 13. FIG. 12 illustrates a schematic configuration diagram of the transfer apparatus 200 according to Example 2 of the present invention. FIG. 13A illustrates an example of a strain detection part 31xe, 31ye, 31ze, 31 θ e when the transfer state is normal. FIG. 13B illustrates an example of the strain detection part 31xe, 31ye, 31ze, 31 θ e when the transfer state is abnormal. Note that since the configuration of the transfer apparatus 200 according to this example is basically the same as the configuration of the transfer apparatus 110 in Example 1, only different portions will be described in the following description.

As illustrated in FIG. 12, a driving means 30 of the transfer apparatus 200 according to this example further includes the strain detection parts 31xe, 31ye, 31ze, 31 θ e in an x-axis direction driving part 31x, a y-axis direction driving part 31y, a z-axis direction driving part 31z, and a θ-direction rotation driving part 31 θ. Here, the strain detection parts 31xe, 31ye, 31ze, 31 θ e is to detect the strains occurring in the driven side pulleys 31Px, 31Py, 31Pz, 31P θ due to the tensile forces of the belts 31Bx, 31By, 31Bz, 31B θ.

The strain detection part 31xe, 31ye, 31ze, 31 θ e will be concretely described using FIG. 13.

As illustrated in FIG. 13, the strain detection, part 31xe, 31 ye, 31ze, 31 θ e can be disposed on support members or rotation shafts of the driven side pulley 31Px, 31Py, 31Pz, 31P θ. The strain detection parts 31xe, 31ye, 31ze, 31 θ e detect the strains occurring in the driven side pulleys 31Px, 31Py, 31Pz, 31P θ due to the tensile forces of the belts 31Bx, 31By, 31Bz, 31B θ. More specifically, the transfer apparatus 200 can detect increases or decreases in the tensile forces of the belts 31Bx, 31By, 31Bz, 31B θ by detecting the amounts of change in the strains by the strain detection parts 31xe, 31ye, 31ze, 31 θ e. Thereby, the transfer apparatus 200 can determine whether the transfer state is normal or abnormal based on the increases or decreases in the tensile forces of the belts 31Bx, 31By, 31Bz, 31B θ.

(Operation of Monitoring Transfer State)

The transfer method of monitoring the transfer state when the transfer apparatus 200 according to Example 2 of the present invention transfers the transferred component (transfer monitoring step) will be described using FIG. 9. Note that since the operation of the transfer apparatus 200 according to this example is basically the same as the operation of the transfer apparatus 110 in Example 1, only different portions will be described.

As illustrated in FIG. 9, the transfer apparatus 200 according to this example executes Step S901 to Step S904 as with the operation of the transfer apparatus 110 in Example 1. The transfer apparatus 200 further detects, after Step S904, the strains occurring in the driven side pulleys 31Px, 31Py, 31Pz, 31P θ by the strain detection parts 31xe, 31ye, 31ze, 31 θ e (belt tensile force detection step).

The transfer apparatus 200 then proceeds to Step S905.

At Step S905, the transfer apparatus 200 analyzes the transfer state by a transfer state analysis part 42 of a transfer monitoring means 40 to determine whether the transfer state is normal or abnormal. The operation of the transfer apparatus 200 determining the transfer state is the same as that in Example 1, and therefore the description thereof will be omitted.

Next, at Step S906, the transfer apparatus 200 identifies the cause of the abnormality of the transfer state and classifies the transfer state by the transfer state analysis part 42 (transfer state classification step). Here, the transfer apparatus 200 in this example can analyze the increases and decreases in the tensile forces of the belts 31Bx, 31By, 31Bz, 31B θ further using the amounts of change in the strains detected by the strain detection parts 31xe, 31ye, 31ze, 31 θ e. Thereby, the transfer state analysis part 42 can discriminate "cut of the belt" from "breakage of the coupling" as the cause of the abnormality further using the amounts of change (the increase/decrease amounts) in the tensile forces of the belts 31Bx, 31By, 31Bz, 31B θ. The transfer state analysis part 42 can similarly discriminate "breakage of the guide" from "breakage of the bearing."

Examples of the monitoring result of the transfer state analyzed by the transfer apparatus 200 are illustrated in Table 2 and Table 3.

TABLE 2

| | Torque differential value monitoring | Torque value monitoring | Strain monitoring | Comparison of rotation operations of motor and driven side pulley |
|---|---|---|---|---|
| Belt cut | dTp (FIG. 10B) | Tn (FIG. 11D) | strain changed | different |
| Coupling breakage | dTp (FIG. 10B) | Tn (FIG. 11D) | strain not changed | different |

TABLE 3

| | Torque differential value monitoring | Torque value monitoring | Strain monitoring | Comparison of rotation operations of motor and driven side pulley |
|---|---|---|---|---|
| Guide breakage | dT (FIG. 10A) | Tp (FIG. 11F) | strain changed | not different |
| Bearing breakage | dT (FIG. 10A) | Tp (FIG. 11F) | strain not changed | not different |

As illustrated in Table 2, the transfer apparatus 200 can identify, by the transfer state analysis part 42, "cut of the belt" as the cause of the abnormality of the transfer state in the case where the peak value dTp of the torque differential value dT and the abnormal waveform Tn of the torque value T become as those in FIG. 10B and FIG. 11D and when the difference between the rotation operations of the motor 31Mx, 31My, 31Mz, 31M θ and the driven side pulley 31Px, 31Py, 31Pz, 31P θ becomes equal to or more than the predetermined difference and the amount of change in the strain detected by the strain detection part 31xe, 31ye, 31ze, 31 θ e is equal to or more than a predetermined value. At this time, the transfer apparatus 200 can classify the transfer state as "abnormal" due to "cut of the belt" by the transfer state analysis part 42. Here, the predetermined value can be a value corresponding to the weight and the transfer conditions of the transferred component and the specifications of the transfer apparatus. Further, the predetermined value can be a value determined in advance by an experiment and numerical calculation and so on. Note that the predetermined value can be decided as described above also in the following description.

Further, the transfer apparatus 200 can identify, by the transfer state analysis part 42, as "breakage of the coupling" as the cause of the abnormality of the transfer state in the case where the peak value dTp of the torque differential value dT and the abnormal waveform Tn of the torque value T become as those in FIG. 10B and FIG. 11D and when the difference between the rotation operations of the motor 31Mx, 31My, 31Mz, 31M θ and the driven side pulley 31Px, 31Py, 31Pz, 31P θ becomes equal to or more than the predetermined difference and the amount of change in the strain is less than the predetermined value. At this time, the transfer apparatus 200 can classify the transfer state as "abnormal" due to "breakage of the coupling" by the transfer state analysis part 42.

Next, as illustrated in Table 3, the transfer apparatus 200 can identify, by the transfer state analysis part 42, "breakage of the guide" as the cause of the abnormality of the transfer state in the case where the torque differential value dT and the peak value Tp of the torque value T become as those in FIG. 10A and FIG. 11F and when the difference between the rotation operations of the motor 31Mx, 31My, 31Mz, 31M θ and the driven side pulley 31Px, 31Py, 31Pz, 31P θ becomes less than the predetermined difference and the amount of change in the strain detected by the strain detection part 31xe, 31ye, 31ze, 31 θ e is equal to or more than the predetermined value. At this time, the transfer apparatus 200 can classify the transfer state as "abnormal" due to "breakage of the guide" by the transfer state analysis part 42.

Further, the transfer apparatus 200 can identify, by the transfer state analysis part 42, as "breakage of the bearing" as the cause of the abnormality of the transfer state in the case where the torque differential value dT and the torque value T become as those in FIG. 10A and FIG. 11F and when the difference between the rotation operations of the motor 31Mx, 31My, 31Mz, 31M θ and the driven side pulley 31Px, 31Py, 31Pz, 31P θ becomes less than the predetermined difference and the amount of change in the strain detected by the strain detection part 31xe, 31ye, 31ze, 31 θ e is less than the predetermined value. At this time, the transfer apparatus 200 can classify the transfer state as "abnormal" due to "breakage of the bearing" by the transfer state analysis part 42.

The operation of the transfer apparatus 200 thereafter is the same as the operation of the transfer apparatus 110 in Example 1, and therefore the description thereof will be omitted.

With the above, the operation of monitoring the transfer state when the transfer apparatus 200 transfers the transferred component ends.

With the above, the transfer apparatus 200 according to Example 2 of the present invention can detect the differential values of the torque values of the motors 31Mx, 31My, 31Mz, 31M θ required to move the driven means when transferring the transferred component by moving the driven, means having the transferred component mounted thereon by the rotational driving forces of the motors 31Mx, 31My, 31Mz, 31M θ, and therefore can detect the abnormality occurring during the transfer using the detected torque differential values. Further, the transfer apparatus 200 according to this example can further use the comparison result of comparing the rotation operations of the motors 31Mx, 31My, 314Mz, 31M θ or the like and the rotation operations of the driven side pulleys 31Px, 31Py, 31Pz, 31P θ or the like, and therefore can detect the abnormality occurring during the transfer. Furthermore, the transfer apparatus 200 according to this example can detect the amounts of change in tensile forces in the belts 31Bx, 31By, 31Bz, 31B θ acting on the driven side pulleys 31Px, 31Py, 31Pz, 31P θ, and therefore can discriminate "cut of the belt" from "breakage of the coupling" as the cause of the abnormality further using the detected amounts of change. Further, the transfer apparatus 200 according to this example can discriminate "breakage of the guide" from "breakage of the bearing" further using the detected amounts of change.

EXAMPLE 3

(Configuration of Transfer Apparatus)

Figure 14:
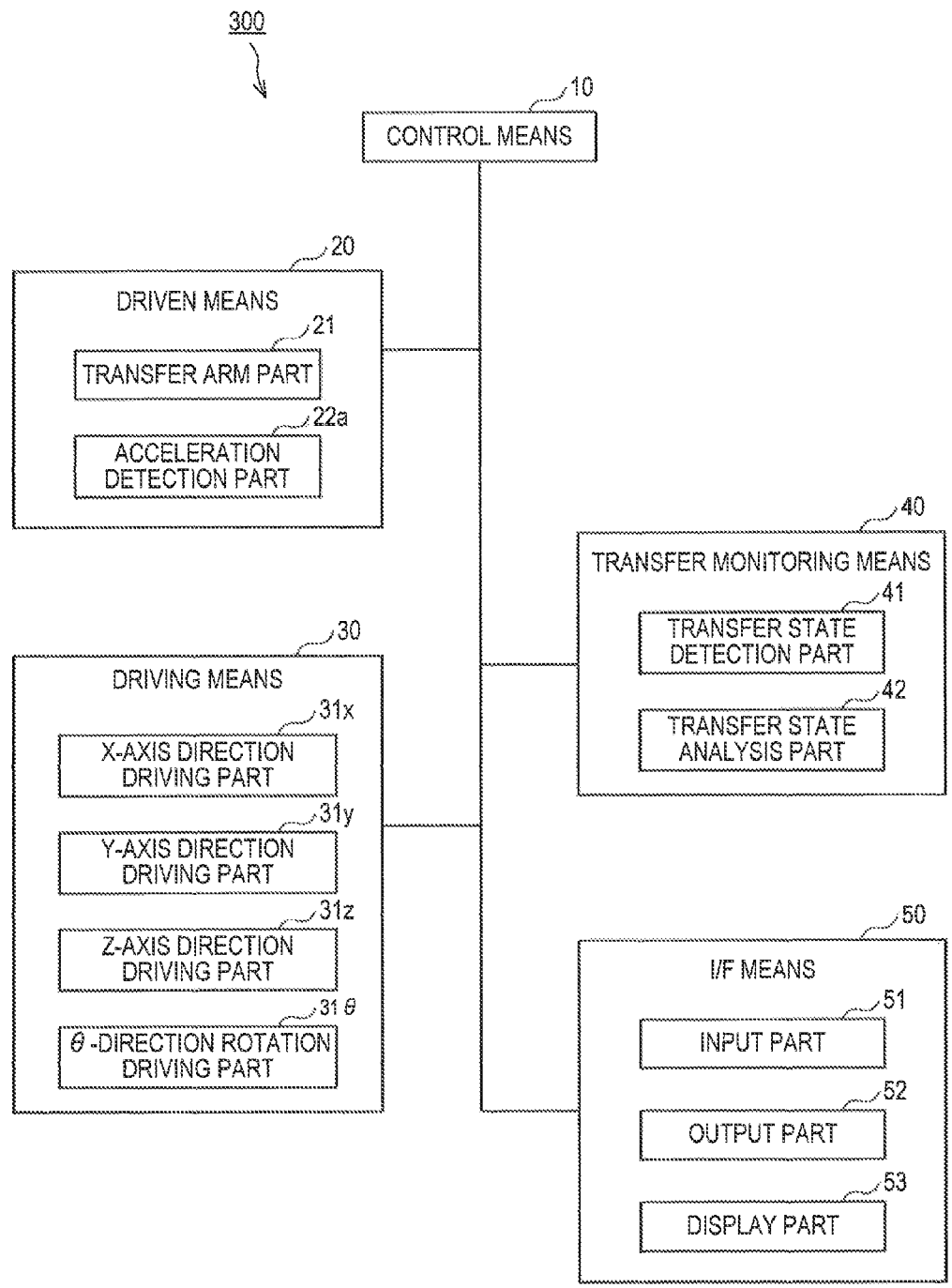
FIG. 14 is a schematic configuration diagram illustrating an example of a transfer apparatus according to Example 3 of the present invention.
Figure 15A:
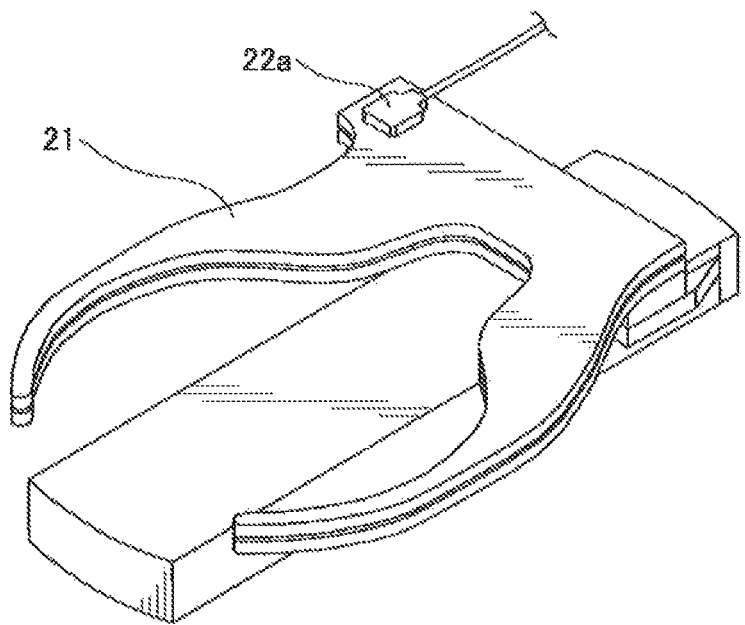
FIG. 15A is a perspective view illustrating an example of a transfer arm on which an acceleration detection part of the transfer apparatus according to Example 3 of the present invention is disposed.
Figure 15B:
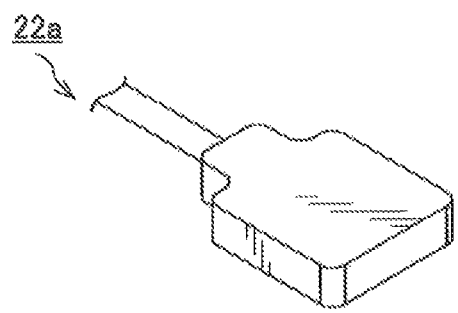
FIG. 15B is a perspective view illustrating an example of an acceleration sensor according to Example 3 of the present invention.

A configuration of a transfer apparatus 300 according to Example 3 of the present invention will be described using FIG. 14 and FIG. 15. FIG. 14 illustrates a schematic configuration diagram of the transfer apparatus 300 according this example. Further, FIG. 15A illustrates a perspective view of a transfer arm part 21 of a driven means 20 on which an acceleration detection part 22a of the transfer apparatus 300 according to this example is disposed. FIG. 15B illustrates an example of an acceleration sensor of the acceleration detection part 22a. Note that the configuration of the transfer apparatus 300 according to this example is basically the same as the configuration of the transfer apparatus 110 in Example 1, only different portions will be described in the following description.

As illustrated in FIG. 14, the transfer apparatus 300 according to this example further includes the acceleration detection part 22a that detects the acceleration of the driven means 20.

As illustrated in FIG. 15, the acceleration detection part 22a in this example is disposed on the transfer arm part 21 of the driven means 20 and can detect the acceleration of the transfer arm part 21. In other words, the transfer apparatus 300 according to this embodiment can detect the transfer state of the driven means 20 further using the acceleration detected by the acceleration detection part 22a. Further, the transfer apparatus 300 can determine whether the transfer state is normal or abnormal further using the detected acceleration. Note that the transfer apparatus 300 may determine whether the transfer state is normal or abnormal based on a speed of the driven means 20 using a speed detection part (not illustrated) or the acceleration calculated from the speed.

(Operation of Monitoring Transfer State)

Figure 16A:
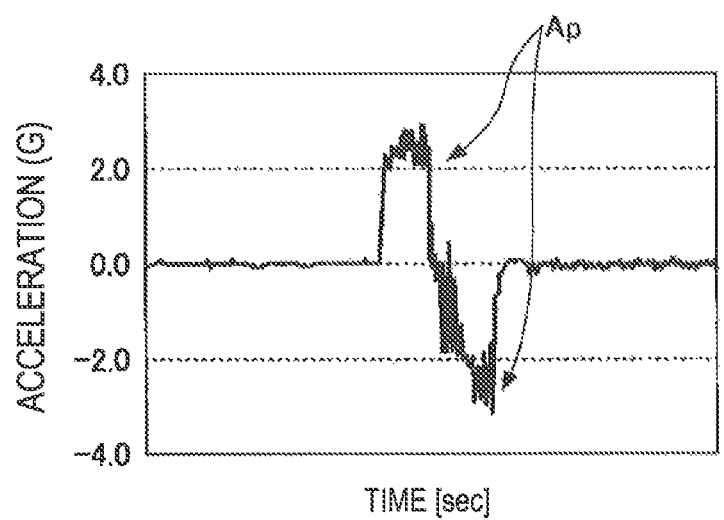
FIG. 16A is an explanatory view illustrating an example of a detection result of the acceleration when the transfer state of the transfer apparatus according to Example 3 of the present invention is normal.
Figure 16B:
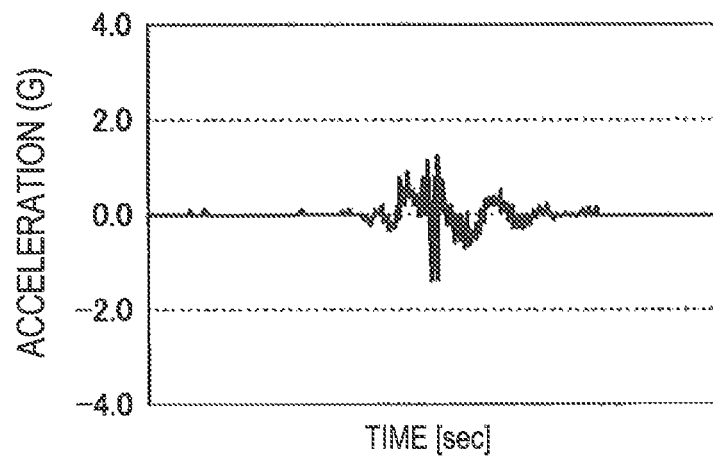
FIG. 16B is an explanatory view illustrating an example of a detection result of the acceleration when the transfer state of the transfer apparatus according to Example 3 of the present invention is abnormal.

The transfer method of monitoring the transfer state when the transfer apparatus 300 according to Example 3 of the present invention transfers the transferred component (transfer monitoring step) will be described using FIG. 9 and FIG. 16. FIG. 16A illustrates an example of the detection result of the acceleration when the transfer state is normal. FIG. 16B illustrates an example of the detection result of the acceleration when the transfer state is abnormal. Note that since the operation of the transfer apparatus 300 according to this example is basically the same as the operation of the transfer apparatus 110 in Example 1, only different portions will be described.

As illustrated in FIG. 9, the transfer apparatus 300 according to this example executes Step S901 to Step S904 as with the operation of the transfer apparatus 110 in Example 1. The transfer apparatus 300 further detects, after Step S904, the acceleration of the driven means 20 by the acceleration detection part 22a of the driven means 20 (acceleration detection step). Specifically, the transfer apparatus 300 can detect the acceleration of the transfer state at normal time as illustrated in FIG. 16A. Further, the transfer apparatus 300 can detect the acceleration of the transfer state at abnormal time as illustrated in FIG. 16B.

The transfer apparatus 300 then proceeds to Step S905.

At Step S905, the transfer apparatus 300 analyzes the transfer state by a transfer state analysis part 42 of a transfer monitoring means 40 to determine whether the transfer state is normal or abnormal. The operation of the transfer apparatus 300 determining the transfer state is the same as that in Example 1, and therefore the description thereof will be omitted. Note that the transfer state analysis part 42 may determine whether the transfer state is normal or abnormal using a peak value Ap of the acceleration detected by the acceleration detection part 22a illustrated in FIG. 16A.

Next, at Step S906, the transfer apparatus 300 identifies, by the transfer state analysis part 42, the cause of the abnormality of the transfer state and classifies the transfer state (transfer state classification step). Here, the transfer apparatus 300 in this example can analyze the transfer state further using the acceleration detected by the acceleration detection part 22a. Thereby, the transfer state analysis part 42 can identify "interference of the driven means" as the cause of the abnormality of the transfer state. Examples of the monitoring result of the transfer state analyzed by the transfer apparatus 300 are illustrated in Table 4.

TABLE 4

| | Torque differential value monitoring | Torque value monitoring | Driven means acceleration monitoring | Comparison of rotation operations of motor and driven side pulley |
|---|---|---|---|---|
| Driven means interference | dTp (FIG. 10B) | Tn (FIG. 11C) | acceleration changed | not different |

As illustrated in Table 4, the transfer apparatus 300 can identify, by the transfer state analysis part 42, "interference of the driven means" as the cause of the abnormality of the transfer state in the case where the peak value dTp of the torque differential value dT and the abnormal waveform Tn of the torque value T become as those in FIG. 10A and FIG. 11C and when the difference between the rotation operations of the motor 31Mx, 31My, 31Mz, 31M θ and the driven side pulley 31Px, 31Py, 31Pz, 31P θ becomes less than the predetermined difference and the peak value Ap of the acceleration detected by the acceleration detection part 22a is less than a predetermined value. At this time, the transfer apparatus 300 can classify the transfer state as "abnormal" due to "interference of the driven means" by the transfer state analysis part 42.

The operation of the transfer apparatus 300 thereafter is the same as the operation of the transfer apparatus 110 in Example 1, and therefore the description thereof will be omitted.

With the above, the transfer apparatus 300 according to Example 3 of the present invention can detect the differential values of the torque values of the motors 31Mx, 31My, 31Mz, 31M θ required to move the driven means when transferring the transferred component by moving the driven means having the transferred component mounted thereon by the rotational driving forces of the motors 31x, 31My, 31Mz, 31M θ, and therefore can detect the abnormality occurring during the transfer using the detected torque differential values. Further, the transfer apparatus 300 according to this example can further use the comparison result of comparing the rotation operations of the motors 31Mx, 31My, 31Mz, 31Mθ or the like and the rotation operations of the driven side pulleys 31Px, 31Py, 31Pz, 31Pθ or the like, and therefore can detect the abnormality occurring during the transfer. Further, the transfer apparatus 300 according to this example can detect the acceleration of the driven means 20 and therefore classify (identify) the cause of the abnormality as "interference of the driven means."

EXAMPLE 4

(Configuration of Transfer Apparatus)

Figure 17:
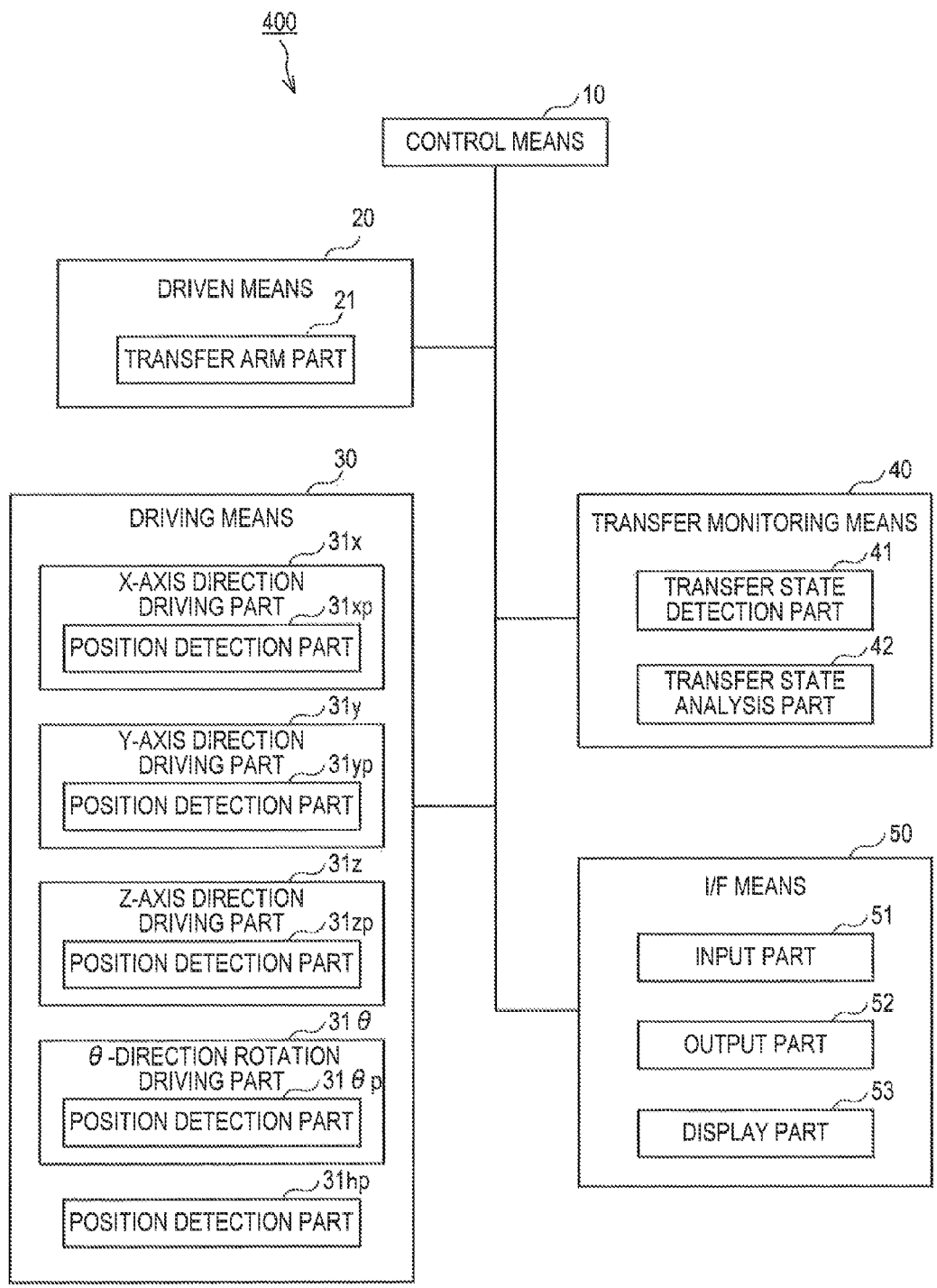
FIG. 17 is a schematic configuration diagram illustrating an example of a transfer apparatus according to Example 4 of the present invention.
Figure 18:
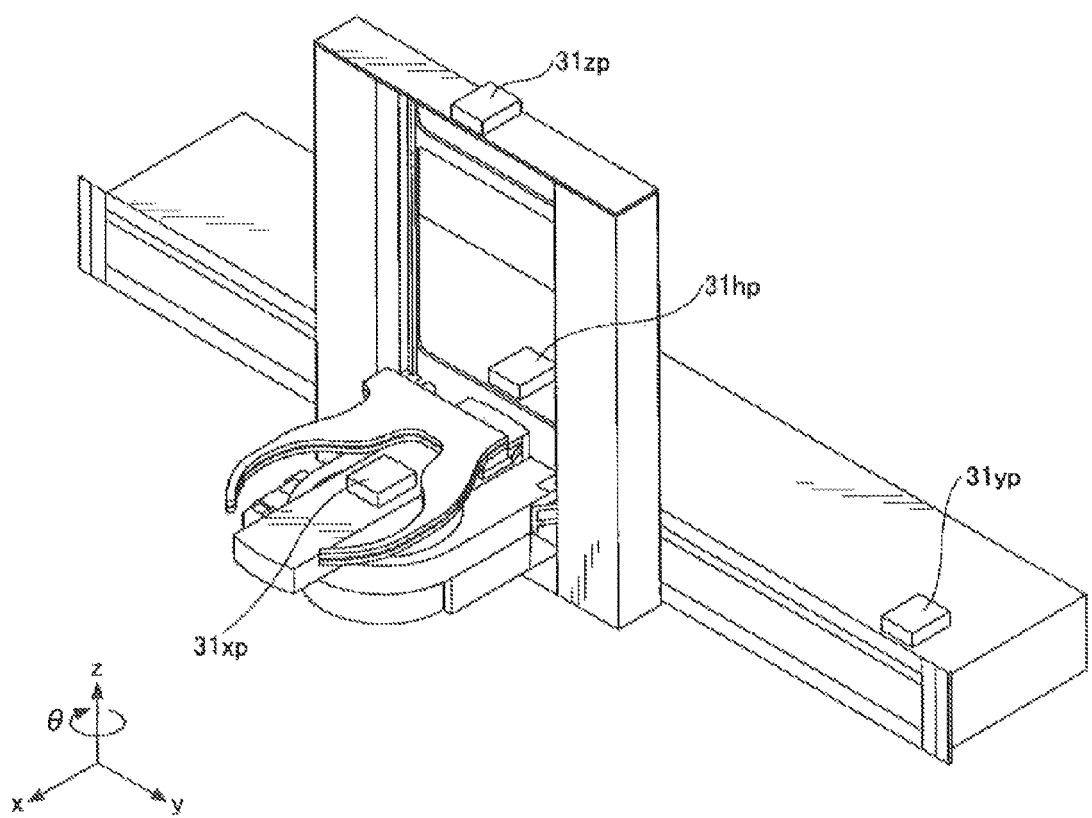
FIG. 18 is a perspective view (schematic external view) illustrating the example of the transfer apparatus according to Example 4 of the present invention.

A configuration of a transfer apparatus 400 according to Example 4 of the present invention will be described using FIG. 17 and FIG. 18. FIG. 17 illustrates a schematic configuration diagram of the transfer apparatus 400 according this example. FIG. 18 illustrates a perspective view of the transfer apparatus 400 on which position detection parts 31xp, 31yp, 31zp, 31hp are arranged. Note that the configuration of the transfer apparatus 400 according to this example is basically the same as the configuration of the transfer apparatus 110 in Example 1, only different portions will be described in the following description.

As illustrated in FIG. 17, the transfer apparatus 400 according to this example further includes the position detection parts 31xp, 31yp, 31zp, 31θp and 31hp arranged in an x-axis direction driving part 31x, a y-axis direction driving part 31y, a z-axis direction driving part 31z, and a θ-direction rotation driving part 31θ. Here, the position detection parts 31xp, 31yp, 31zp, 31θp, 31hp are to detect the position of the driven means 20.

The arrangement of the position detection parts 31xp and the like will be described using FIG. 18. As illustrated in FIG. 18, a driving means of the transfer apparatus 400 has the position detection parts 31xp, 31yp, 31zp arranged in the x-axis direction driving part 31x, the y-axis direction driving part 31y, and the z-axis direction driving part 31z. The transfer apparatus 400 further has the position detection part 31hp arranged at a waiting position (initial position, home position) of the driven means 20. Note that the illustration of the position detection part 31θp arranged in a θ-direction rotation driving part 31θ is the same as those of the position detection parts 31 xp and the like, and is therefore omitted.

The transfer apparatus 400 can identify the position of the driven means 20 based on whether each of the position detection parts 31xp, 31yp, 31zp, 31θp, 31hp can detect the driven means 20. In other words, the transfer apparatus 400 can detect information about the position of the driven means 20 by the detection results of the position detection parts 31xp, 31yp, 31zp, 31θp, 31hp. Thereby, the transfer apparatus 400 can determine whether the transfer state is normal or abnormal further using the detected information about the position of the driven means 20.

(Operation of Monitoring Transfer State)

The transfer method of monitoring the transfer state when the transfer apparatus 400 according to Example 4 of the present invention transfers the transferred component (transfer monitoring step) will be described using FIG. 9. Note that since the operation of the transfer apparatus 400 according to this example is basically the same as the operation of the transfer apparatus 110 in Example 1, only different portions will be described.

As illustrated in FIG. 9, the transfer apparatus 400 according to this example executes Step S901 to Step S904 as with the operation of the transfer apparatus 110 in Example 1. The transfer apparatus 400 further detects the information about the position of the driven means 20 by the position detection part 31xp, 31yp, 31zp, 31θp, 31hp (driven means position detection step). The transfer apparatus 400 then proceeds to Step S905.

At Step S905, the transfer apparatus 400 analyzes the transfer state by a transfer state analysis part 42 of a transfer monitoring means 40 to determine whether the transfer state is normal or abnormal. The operation of the transfer apparatus 400 determining the transfer state is the same as that in Example 1, and therefore the description thereof will be omitted. Note that the transfer state analysis part 42 may determine whether the transfer state is normal or abnormal using the detection results detected by the position detection parts 31xp, 31yp, 31zp, 31θp, 31hp.

Next, at Step S906, the transfer apparatus 400 identifies, by the transfer state analysis part 42, the cause of the abnormality of the transfer state and classifies the transfer state. Here, the transfer apparatus 400 in this example can analyze the transfer state further using the information about the position of the driven means 20 detected by the position detection parts 31xp and the like. In other words, the transfer apparatus 400 can detect whether the driven means 20 is located at a predetermined position by the position detection parts 31xp, 31yp, 31zp, 31θp, 31hp. For example, when the driven means 20 cannot be moved to the waiting position, for example, in the "driven means initializing operation" in Table 1, the transfer apparatus 400 can classify (identify) the cause of the abnormality as "cut of the belt and breakage of the coupling."

The operation of the transfer apparatus 400 thereafter is the same as that of the transfer apparatus 110 in Example 1, and therefore the description thereof will be omitted.

With the above, the transfer apparatus 400 according to Example 4 of the present invention can detect the differential values of the torque values of the motors required to move the driven means when transferring the transferred component by moving the driven means having the transferred component mounted thereon by the rotational driving forces of the motors, and therefore can detect the abnormality occurring during the transfer using the detected torque differential values. Further, the transfer apparatus 400 according to this example can further use the comparison results of comparing the rotation operations of the motors or the like and the rotation operations of the driven side pulleys or the like, and therefore can detect the abnormality occurring during the transfer. Further, the transfer apparatus 400 according to this example can detect the position of the driven means 20 and therefore can detect the abnormality occurring during the transfer based on the detected position of the driven means 20.

The present invention has been described with reference to the embodiment and examples in the above, and the present invention is not limited to them but can be variously changed and modified within the scope of the accompanying claims.

What is claimed is:

1. A transfer apparatus for mounting and transferring a transferred component on a driven means, said transfer apparatus comprising:

a driving means configured to rotate a driving side pulley by a rotational driving force of a motor to move a belt wound around said driving side pulley, thereby moving said driven means coupled to said belt in a predetermined direction;

a torque detector configured to produce a torque signal indicative of a torque value of the motor required to move the driven means; and a transfer monitoring means comprising a transfer state detection means configured to determine the torque value of said motor required to move said driven means based on the torque signal, and configured to calculate a torque differential value of the torque value with respect to time, and a transfer state analysis means for detecting the transfer state of the driven means using the calculated torque differential value.

2. The transfer apparatus as set forth in claim 1,
wherein said driving means further comprises a driven side pulley rotating according to movement of said belt, and
wherein said transfer monitoring means detects the transfer state further using a comparison result of comparing a rotation operation of said motor and a rotation operation of said driven side pulley or a comparison result of comparing a rotation operation of said driving side pulley and the rotation operation of said driven side pulley.

3. The transfer apparatus as set forth in claim 2,
wherein said transfer monitoring means further detects a tensile force of said belt acting on said driven side pulley, and detects the transfer state further using the detected tensile force.

4. The transfer apparatus as set forth in claim 1,
wherein said driving means further comprises a seal side belt and a seal side pulley arranged at positions facing said driving side pulley for waterproof or dustproof of said driving side pulley, said belt, and said motor,
wherein said seal side belt moves according to movement of said driven means,
wherein said seal side pulley rotates according to movement of said seal side bet, and
wherein said transfer monitoring means detects the transfer state further using a comparison result of comparing a rotation operation of said motor and a rotation operation of said seal side pulley.

5. The transfer apparatus as set forth in claim 1,
wherein said transfer monitoring means further detects an acceleration of said driven means and detects the transfer state further using the detected acceleration.

6. The transfer apparatus as set forth in claim 1,
wherein said driving means moves said driven means to a predetermined position, and
wherein said transfer monitoring means detects information about a position of said driven means moving to the predetermined position, and detects the transfer state further using the detected information about the position.

7. The transfer apparatus as set forth in claim 1,
wherein said transfer monitoring means classifies the transfer state into one class or a plurality of classes of:
slip or cut of said belt;
breakage of a coupling transmitting the rotational driving force;
interference of said driven means;
collision of said driven means;
breakage of a guide guiding said driven means in a predetermined direction; and
breakage of a bearing rotatably supporting a rotation shaft rotated by the rotational driving force.

8. The transfer apparatus as set forth in claim 1, further comprising:
at least one of an output part and a display part,
wherein said transfer monitoring means performs at least one of output of a result of detecting the transfer state to said output part and display of the result of detecting the transfer state on said display part.

9. A transfer method of mounting and transferring a transferred component on a driven means, said method comprising:
a transfer monitoring step of monitoring a transfer state of the transferred component;
a transferred component mounting step of mounting the transferred component on the driven means; and
a driven means moving step of moving the driven means in a predetermined direction by a rotational driving force of a motor,
wherein said transfer monitoring step comprises
a torque value detection step of detecting a torque value of the motor required to move the driven means,
a torque differential value calculation step of calculating a torque differential value of the torque value with respect to time based on the detected torque value, and
a transfer state classification step of classifying the transfer state using the calculated torque differential value.

10. The transfer method as set forth in claim 9,
wherein said driven means moving step comprises
a driving side pulley rotation step of rotating a driving side pulley by a rotational driving force of the motor,
a belt moving step of moving a belt wound around the rotating driving side pulley, and
a driven side pulley rotation step of rotating a driven side pulley according to movement of the belt, and
wherein said transfer state classification step classifies the transfer state further using a comparison result of comparing a rotation operation of the motor and a rotation, operation of the driven side pulley or a comparison result of comparing a rotation operation of the driving side pulley and the rotation operation of the driven side pulley.

11. The transfer method as set forth in claim 9,
wherein said transfer monitoring step classifies the transfer state further using one step or a plurality of steps of
a belt tensile force detection step of detecting a tensile force of the belt acting on the driven side pulley,
a seal side pulley rotation detection step of detecting a rotation operation of a seal side pulley arranged on a position facing the driving side pulley for waterproof or dustproof of the driving side pulley,
an acceleration detection step of detecting an acceleration of the driven means, and
a driven means position detection step of detecting information about a position of the driven means.

\* \* \* \* \*